United States Patent

Nakashima et al.

[11] Patent Number: 6,162,569
[45] Date of Patent: *Dec. 19, 2000

[54] METHOD FOR MANUFACTURING FINE PATTERN, AND COLOR FILTER, SHADING PATTERN FILTER AND COLOR LCD ELEMENT FORMED AND PRINTED BOARD BY USING THE SAME

[75] Inventors: Kouji Nakashima, Dazaifu; Keita Ihara, Kasuga; Hidetoshi Matsumoto; Takahiro Oomori, both of Dazaifu, all of Japan

[73] Assignee: Matsushita Electric Industrial Co., Ltd., Osaka, Japan

[*] Notice: This patent is subject to a terminal disclaimer.

[21] Appl. No.: 09/165,129

[22] Filed: Oct. 2, 1998

Related U.S. Application Data

[63] Continuation-in-part of application No. 08/967,941, Nov. 12, 1997, Pat. No. 5,961,735.

[30] Foreign Application Priority Data

| Nov. 21, 1996 | [JP] | Japan | 8-310349 |
| Dec. 4, 1996 | [JP] | Japan | 8-323783 |
| Jul. 2, 1997 | [JP] | Japan | 9-176721 |
| Oct. 6, 1997 | [JP] | Japan | 9-272345 |

[51] Int. Cl.[7] .............. C25D 9/02; G02B 5/20; G02F 1/1335

[52] U.S. Cl. .............. 430/7; 430/314; 205/120; 205/122; 205/224; 205/229

[58] Field of Search ............ 430/314, 7; 216/13, 216/24, 54; 205/120, 122, 158, 170, 188, 224, 229; 349/106

[56] References Cited

U.S. PATENT DOCUMENTS

| 4,522,691 | 6/1985 | Suginaya et al. | 205/229 |
| 4,853,092 | 8/1989 | Matsumura et al. | 205/120 |
| 5,578,184 | 11/1996 | Imataki et al. | 205/118 |
| 5,916,735 | 6/1999 | Nakashima et al. | 430/314 |

FOREIGN PATENT DOCUMENTS

| 0288073 | 10/1988 | European Pat. Off. |
| 0299508 | 1/1989 | European Pat. Off. |
| 0612062 | 8/1994 | European Pat. Off. |
| 61-149984 | 7/1986 | Japan |
| 61-233704 | 10/1986 | Japan |
| 63-121848 | 5/1988 | Japan |
| 63-266482 | 11/1988 | Japan |
| 3150376 | 6/1991 | Japan |
| 4009902 | 1/1992 | Japan |
| 4260389 | 9/1992 | Japan |

*Primary Examiner*—John A. McPherson
*Attorney, Agent, or Firm*—Stevens, Davis, Miller & Mosher, L.L.P.

[57] ABSTRACT

A method for manufacturing a fine pattern includes steps of forming a master substrate having an electrode layer patterned to a predetermined shape, forming peel layers made of a conductive water-repellent thin film on the master substrate, forming the fine pattern made of the electrodeposit resin on the peel layers, impregnating the electrodeposit resin with water, and stripping the fine pattern off the master substrate and transferring the fine pattern on a bonding layer of the media substrate. A color filter and a shading pattern filter are manufactured by the method for manufacturing the fine pattern. The color LCD element includes plastic film substrates, a transparent pixel electrode, a liquid crystal material, and color filters. The color filters are pasted on the plastic film with a bonding film laid therebetween. The color LCD element includes fine emittable filters two-dimensionally created as the color filter on a light-transmissive substrate so that the emittable filter is composed to seal at least one kind of the light-storage and the fluorescent coloring particles in the electrodeposit resin layer.

22 Claims, 19 Drawing Sheets

FIG.1
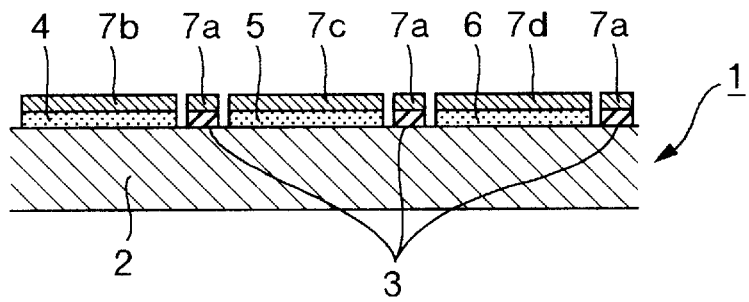
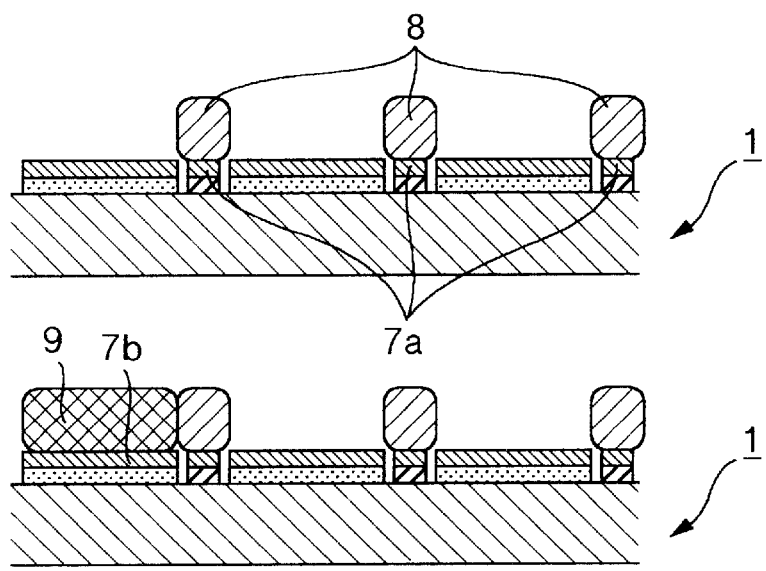
FIG.2A
FIG.2B
FIG.2C
FIG.2D

METHOD FOR MANUFACTURING FINE PATTERN, AND COLOR FILTER, SHADING PATTERN FILTER AND COLOR LCD ELEMENT FORMED AND PRINTED BOARD BY USING THE SAME

CROSS REFERENCE TO RELATED APPLICATION

This application is a Continuation-In-Part of U.S. patent application Ser. No. 08/967941 filed on Nov. 12, 1997 and now U.S. Pat. No. 5,961,735, and the contents of which are incorporated herein by reference.

BACKGROUND OF THE INVENTION

The present invention relates to a method for forming a fine pattern and more particularly to a method for manufacturing the fine pattern used for forming a color LCD element used for a display unit such as an information terminal, a color filter used for a color image sensor and a color scanner, and a shading pattern filter 1 as well as the fine pattern used for an etching mask or a plating mask used in forming a high-density printed board built in a semiconductor packaging such as an IC card terminal and an electronic instrument such as a portable information terminal and a variety of printed boards such as a multi-layered printed board and a flexible printed board, the color filter and the shading pattern formed by the method, and the color LCD element and the printed board arranged to use the color filter.

As a conventional method for forming a fine pattern used for forming the color filter and the shading pattern filter used for a LCD element, for example, a pigment dispersing method has been realized where coloring pigment is fine dispersed in photo resist. For forming the fine pattern, the pigment dispersing method adopts a photolithograph technique often used for a semiconductor process. This pigment dispersing method, however, needs a process of coating photo resist and an exposure process for each wafer so that the method gives rise to an intricated manufacturing process and needs an expensive exposure device. Further, as a method for manufacturing the printed board, for example, the subtracting method and the additive method have been conventionally proposed. The subtracting method is arranged to form a predetermined insulating circuit pattern on a copper foil on the surface of a coppered substrate and then removing an unnecessary portion of the copper foil by an etching process with the circuit pattern as an etching mask, for forming wiring conductors. The additive method is arranged to apply catalyzer on the surface of an insulating substrate with no copper foil, form a predetermined insulating circuit pattern on the surface of the substrate, and forming wiring conductors by an electroless copper plating technique with the circuit pattern as a plating mask.

On the other hand, as a method for forming the insulating circuit pattern on the surface of the substrate, for example, a photolithograph method may be referred which is arranged to develop a photo resist by exposure. It is known that this method is often used in the semiconductor process. This photolithograph method provides an intricated manufacturing process because it needs processes of coating and exposing the photo resist on each layer. Further, various devices used by this method such as an ultraviolet exposing device are so costly that the resulting product manufactured by this lithography method is made expensive. To overcome these shortcomings, from various points of view, there have been studied various manufacturing methods with which the fine pattern can be manufactured more easily and at low cost and a precision of forming the fine pattern can be improved.

As an example, JP-A-61-233704 has disclosed a method for forming a fine pattern for the color filter. This method includes the steps of: exposing and developing resist containing pigment fine dispersed therein for forming a fine pattern on a surface of a peel layer made of organic polymer on a master substrate; and stripping the fine pattern off the master substrate and transferring the fine pattern on a media substrate with an adhesive imaging layer made of organic polymer by virtue of heat and pressure given by a laminator. This method, however, needs to keep the thermal expansion of the master substrate suitable to that of the media substrate since it utilizes heat and pressure for the stripping and transferring operation. This may degrade the fine pattern in transfer.

Likewise, as a method for forming a fine pattern used for the color filter, JP-A-63-266482 has disclosed the method taking the steps of: partially electrodepositing proper resin for each color for forming a fine pattern on an insulating master substrate having electrodes shaped to the form of the color filter; and bonding and pressurizing the fine pattern on the media substrate with adhesion of the resin itself for stripping and transferring the fine pattern. This method has a merit that the master substrate can be repetitively used. However, the strip and transfer of the fine pattern with the adhesion of the resin itself disadvantageously results in weakening bonding force of the resin with the media substrate, thereby being unable to completely stabilize the strip and transfer.

From the above-mentioned point of view, for more reliably stripping and transferring the fine pattern on the media substrate, a proposal has been made in JP-A-3-150376. This proposal for stripping and transferring the fine pattern concerns with a method which takes the steps of: forming a peel layer made of a releasable coating film on a master substrate; electrodepositing a fine pattern made of electrodeposit resin on the peel layer; and bonding and pressurizing the electrodeposit resin on a bonding layer formed on a media substrate. Further, a method dedicated to an etching mask has been disclosed in JP-A-4-260389. This method takes the steps of: forming a pattern of an electrodeposit adhesive agent on a fine pattern formed by the partial electrodeposition of the resin; mirror-processing a conductive layer where no masking layer is formed for giving rise to a peeling effect; and bonding and pressurizing the patterns onto a media substrate. This method for stripping and transferring the fine pattern on the media substrate therefore utilizes the adhesive characteristic of the electrodeposit agent pattern.

However, this conventional method for forming the fine pattern is disadvantageous in that the fine pattern cannot be completely stripped and transferred or misshaped when stripping and transferring the fine pattern from the master substrate to the media substrate, because the fine pattern made of the electrodeposit resin has strong bonding force to the master substrate. Moreover, since the fine pattern strongly bonded on the master substrate is forced to be stripped, this method gives a damage to the master substrate and thus shortens the repetitive usable duration of the master substrate.

On the other hand, the conventional LCD element is used for a display device of an information terminal such as a personal computer or a toy device such as a video game. In particular, the display device used in the portable information terminal or the toy device utilizes lots of LCD elements, because such devices are required to be reduced in size, weight and power consumption. As the display device keeps its displayed content more variable and its density higher, the demands for the LCD element, in particular, a color LCD element are going higher and higher year by year.

The conventional color LCD element is arranged to have a transparent substrate having a transparent pixel electrode formed thereon, a transparent substrate having a color filter and a transparent pixel electrode laminated thereon, and a liquid crystal material laid between both of the transparent substrates with their transparent pixel electrodes opposed to each other. Further, a deflection plate is located outside of each of the transparent substrates, so that a light source is provided in close proximity to one deflection plate.

The transparent substrate of the color LCD element has often used a glass substrate. Unfortunately, however, the glass substrate occupies a large weight ratio of the overall color LCD element and has difficulty in thinning. To reduce the LCD element in weight and thickness, the use of a plastic film substrate for the color LCD element is not being studied. For example, JP-A-61-149984 discloses the color LCD element which includes a plastic film substrate having a transparent pixel electrode formed thereon, another plastic film substrate having a transparent pixel electrode formed on one surface thereof and a color filter formed on the other surface thereof, and a liquid crystal material laid between both of the plastic film substrates with their transparent pixel electrode sides opposed to each other. Moreover, there are located deflection plates outside of the plastic film substrate and the color filter. A light source is provided in close proximity to the deflection plate located on the side of the color filter.

However, the plastic film substrate is so low in rigidity that the plastic film substrate on which the color filter is to be formed has difficulty in keeping its flatness excellent. When the pigment dispersing method is used for forming the color filter, the coating amount of resist containing the pigment fine dispersed therein is made so uneven that the film thickness of the color filter is distributive and the patterning precision of the color filter is made lower and thereby the precision with which the color filter is formed is lowered. As a result, this conventional method disclosed in JP-A-61-149984 has a disadvantage that the strength of the passing light is so uneven that color shading in a narrow range and brightness shading in a large range are brought about.

On the other hand, as mentioned earlier, the LCD element may have various types of light sources. For example, a transmission type LCD element that provides a light source such as a cold cathode fluorescent lamp on its rear portion, a reflection type LCD element that provides a reflection plate for reflecting an external ray incident to the rear portion of the LCD element, or a half-transmission type of LCD element that provides a half-transmission reflection plate and a light source such as an LED on the rear portion of the LCD element.

The transmission type LCD element uses a light source, so that it may be used in a dark place and thus provide a vivid image, while it has a large power consumption. This imposes restriction on an operating time of the display. To overcome this drawback, this LCD element is required to provide a large-volume battery, which leads to an obstacle to reducing a portable display in size. This holds true to the half-transmission type LCD element.

On the other hand, the reflection type LCD element does not include a light source, so that it does not consume electric power so much and can be operated for a far longer time than the transmission type or the half-transmission type LCD element. However, the reflection type LCD element disables to display the image unless the ambient light is incident to the LCD element. It means that this type LCD element cannot be used in a dark place. For example, therefore, if it is applied to a portable phone that is now under progressive prevailing, this type LCD element lacks in correspondence to an urgent condition such as a blackout. In addition, this type LCD element utilizes as a light source the light reflected on the rear portion, so that its light quantity is smaller than that of the transmission type LCD element. It means that the reflection type LCD element inevitably lowers its brightness and in particular degrades vividness of the colored display.

The present invention is made to overcome the foregoing disadvantages the prior art involves.

It is an object of the present invention to provide a method for manufacturing a fine pattern with which method a fine pattern formed on a master substrate is allowed to be completely stripped and transferred onto a media substrate without changing the shape of the fine pattern and with excellent reproducibility and with reliance, the repetitive use of the master substrate is made possible, and the high-definition and high-density fine pattern can be mass-produced with ease, and a color filter, a shading pattern filter and a printed board which are formed to have the high-definition and high-density fine patterns by the manufacturing method and is excellent in massproductivity and precision of forming the pattern.

It is a further object of the present invention to provide a color LCD element which utilizes the color filter and enables to offer a highly color reproducible image without color and brightness shadings.

It is a yet further object of the present invention to provide a color filter which keeps a color-emitting function for a certain limited interval later than when light from a light source or ambient light disappears and enables to offer a color-emitting function with high brightness and vividness even in the environment where a light volume is short, and a color LCD element provided with the color filter.

SUMMARY OF THE INVENTION

In order to overcome the foregoing disadvantages, a method for manufacturing a fine pattern according to an aspect of the present invention includes a step of making a master substrate having an insulating substrate and an electrode layer patterned to a predetermined shape and formed on the insulating substrate, a step of forming a peel layer made of a conductive water-repellent thin film formed on the master substrate, a step of forming a fine pattern made of electrodeposit resin on the peel layer, a step of impregnating the electrodeposit resin with water, and a step of stripping and transferring the fine pattern from the master substrate to a bonding layer of the media substrate.

In this composition, when impregnating the inside of the electrodeposit resin with water for forming the fine pattern in the water-impregnating step, since the peel layer is water-repellent, the bonding force of the electrodeposit resin with the peel layer is remarkably weakened. Hence, the fine pattern is allowed to be completely stripped off the master substrate and transferred onto the bonding layer of the media substrate with reliance.

The strip and transfer is executed in the state that the bonding force of the electrodeposit resin to the peel layer is remarkably weakened. In the case of the strip and transfer, no damage is given to the peel layer and the patterned electrode layer of the master substrate, so that the same master substrate can be used for forming a quite reproducible and regular fine pattern and can be repetitively used for extending its life.

Since the bonding force of the electrodeposit resin with the peel layer can be weakened, the bonding layer having relatively weak bonding strength may be used as the media substrate, so that the master substrate is forcibly stripped off the media substrate in the strip and transfer. This leads to preventing the fine pattern from misshaped or impaired.

With the aforementioned function, the patterned electrode layer can be compactly formed on the master substrate at high density by means of a photolithograph technique. Hence, the method for manufacturing the fine pattern provides a capability of manufacturing a high-definition and high-density fine pattern with ease and with massproductivity.

The color filter according to an aspect of the present invention is manufactured by the method for manufacturing a fine pattern according to the invention and is composed to have a flexible and light-transmissive media substrate, a light-transmissive bonding layer formed on the media substrate, and fine patterns made of electrodeposit resin of at least two colors and formed on the bonding layer.

The shading pattern filter according to an aspect of the invention is manufactured by the method for manufacturing a fine pattern according to the invention is composed to have a flexible and light-transmissive media substrate, a light-transmissive bonding layer formed on the media substrate, and a shading pattern made of shading electrodeposit resin and formed on the bonding layer.

These compositions provide the color filter and the shading pattern filter that contain the high-definition and high-density fine pattern and are excellent in mass-productivity.

Further, the color LCD element according to an aspect of the present invention is composed to have a pair of plastic film substrates located as opposed to each other, a transparent pixel electrode formed on the opposed surface of each plastic film substrate, a liquid crystal material sealed between the plastic film substrates, and a color filter located on the outside surface of one of the plastic film substrates, wherein the color filter manufactured by the method for manufacturing a fine pattern according to the invention is pasted on the plastic film substrate with an adhesive film laid therebetween.

The color LCD element composed as described above provides a capability of displaying a highly color-reproducible and high-quality image without color and brightness shadings on the display, because the characteristic of the color filter pre-manufactured with high precision of forming a fine pattern is independent of the surface state of the plastic film substrate unlike the conventional color filter.

Further, the color filter according to an aspect of the invention is manufactured by the method for manufacturing a fine patter according to the invention and is composed to create a fine luminous pattern as a two-dimensional pattern on the light-transmissive substrate. The luminous pattern is composed to seal either or both of light-storage and fluorescent coloring particles in the electrodeposit resin.

This composition contains either or both of the light-storage and fluorescent luminous particles in the electrodeposit resin. By expanding the electrodeposit resin layer in a two-dimensional pattern as a luminous pattern, if the luminous particles are light-storing, the resulting color filter enables to offer color emissions in a dark place with light stored when it is received or if the luminous particles are fluorescent, the resulting color filter enables to offer vivid color emissions with high brightness.

Moreover, the color LCD element according to the invention is composed to have the foregoing color filter and the LCD element optically connected thereto.

This composition provides a color LCD element which enables to keep a color-emitting function for a limited duration after light from the light source or ambient light disappears and offers vivid coloring emissions with high brightness even in the environment where a light volume is short.

Further, a method for manufacturing the fine pattern according to the invention includes a step of forming a patterned electrode layer of a given shape on a substrate as a master substrate, a step of forming a peel layer composed of a water-repellent film on the master substrate, a step of forming a patterned film on the peel layer by means of an electrodeposition process, a step of impregnating the fine pattern film with hot water whose temperature ranges from 40° C. to 90° C., and a step of putting the patterned film formed on the master substrate and impregnated with the hot water in close contact with a media substrate for stripping the patterned film off the master substrate and transferring it on the media substrate. The impregnation of the patterned film formed of an electrodeposit resin with hot water at the water-impregnating step allows the inside of the patterned film to be impregnated with hot water, so that the adhesion of the fine pattern film may be weakened by water repellency of the peel layer coated on the surface of the master substrate and the heated surface of the patterned film is made viscous. The weakened adhesion and the viscosity are effective in completely stripping the patterned film off the substrate and transferring it on the media substrate with excellent reproducibility and make it easier to do the complete stripping and transferring of the patterned film. This method therefore makes use of the electrodeposit resin with weak cohesion, that is, the electrodeposit resin that is unlikely to be transformable and makes it possible to completely stripping and transferring the patterned film without changing the shape of the fine pattern.

The peel layer is a water-repellent thin film formed on the master substrate. The thin film is formed of Perfluoro polyether having a silicon system compound or a titanium system compound on a terminal group. This peel layer thus has a property that its terminal group is likely to adhere to the electrode layer of the master substrate, so that the water-repellent thin film formed of Perfluoro polyether having conductivity in liquid because of its thinness may be easily and uniformly formed on the master substrate. At a time, in reusing the master substrate, the peel layer may be easily reproduced.

Then, since the patterned film formed of the electrodeposit resin includes particles other than the electrodeposit resin ones, the patterned film is not likely to be transformable, so that the formed fine pattern may be kept without change when transferring it.

Besides, the printed board of the present invention is manufactured by the method for manufacturing the fine pattern according to the present invention and is excellent in massproductivity and low in cost.

BRIEF DESCRIPTION OF THE DRAWINGS

FIG. 1 is a sectional view showing an essential portion of a master substrate formed at a step of forming a peel layer included in a method for manufacturing a fine pattern according to a first embodiment of the present invention.

FIG. 2A is a sectional view showing an essential portion of a master substrate formed at a step of forming a fine pattern included in the method for manufacturing a fine pattern according to the first embodiment of the present invention.

FIG. 2B is a sectional view showing an essential portion of the master substrate formed at a step of forming a fine pattern included in the method for manufacturing a fine pattern according to the first embodiment of the present invention.

FIG. 2C is a sectional view showing an essential portion of the master substrate formed at a step of forming a fine pattern included in the method for manufacturing a fine pattern according to the first embodiment of the present invention.

FIG. 2D is a sectional view showing an essential portion of the master substrate formed at a step of forming a fine pattern included in the method for manufacturing a fine pattern according to the first embodiment of the present invention.

Figure 3:
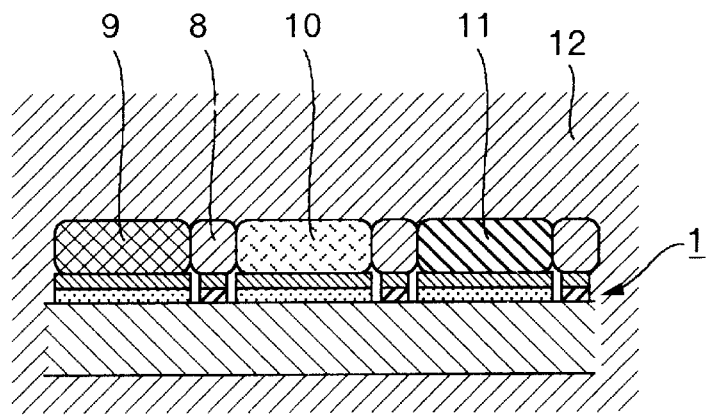
FIG. 3 is a sectional view showing an essential portion of the master substrate for indicating a water-impregnating step included in the method for manufacturing a fine pattern according to the first embodiment of the preset invention.

DETAILED DESCRIPTION OF THE PREFERRED EMBODIMENT (1) A first aspect of the invention includes the steps of: making a master substrate having an insulating substrate and an electrode layer patterned to a given shape and formed on the insulating substrate; forming a peel layer made of a conductive water-repellent thin film on the master substrate; forming a fine pattern made of electrodeposit resin on the peel layer; impregnating the electrodeposit resin with water; and stripping the fine pattern off the master substrate and transferring the fine pattern on a bonding layer of a media substrate. At the water-impregnating step, water is impregnated inside of the electrodeposit resin composing the fine pattern. Since the peel layer is water-repellent, the bonding force of the electrodeposit resin with the peel layer is remarkably weakened, so that the fine pattern can be completely stripped off the master substrate and transferred onto the bonding layer of the media substrate.

(2) At the water-impregnating step, the electrodeposit resin is impregnated with hot water of 30° C. to 70° C., preferably, about 50° C. This makes it possible to sufficiently impregnate the inside of the electrodeposit resin with water as progressively vaporizing water from the surface of the electrodeposit resin. Hence, the invention also provides the functions of more easily stripping the fine pattern off the master substrate and improving the bonding characteristic of the fine pattern onto the media substrate.

(3) According to another aspect of the invention at the strip and transfer step, the bonding layer of the media substrate is heated before transferring the fine pattern thereon. The heated media substrate makes it possible to quickly vaporize water on the surface of the electrodeposit resin composing the fine pattern at the strip and transfer step. The invention therefore provides the functions of improving the bonding characteristic of the bonding layer of the media substrate with the electrodeposit resin and shortening the waiting time between the water-impregnating step and the strip and transfer step.

(4) According to another aspect of the invention, at the strip and transfer step the inventions, the master substrate and the media substrate pressurized on the master substrate are heated together for stripping and transferring the fine pattern. The heated substrates make it possible to quickly vaporize water on the surface of the electrodeposit resin composing the fine pattern at the strip and transfer step, improve the bonding characteristic of the bonding layer of the media substrate with the electrodeposit resin, and shorten a waiting time between the water-impregnating step and the strip and transfer step. Further, the application of heat and pressure makes it possible to realize a high bonding characteristic between the bonding layer and the electrodeposit resin for a short time.

(5) According to another aspect of the Invention, at the step of forming the peel layer, the peel layer to be formed on the master substrate is made of a metal film containing fluoroplastic. The invention therefore provides the function of easily forming a conductive water-repellent thin film through the plating technique or the like.

(6) According to another aspect of the Invention, that at the step of forming the peel layer, the peel layer to be formed on the master substrate is made of a fluororesin film. The invention therefore provides the function of easily forming a conductive water-repellent thin film through the sputtering technique or the like and adjusting a film thickness with high precision.

(7) According to another aspect of the Invention, at the step of forming the peel layer, the peel layer is formed a fluorocarbon coating agent. The invention of therefore provides the functions of easily forming a conductive water-repellent thin film through the dip-coating technique or the like and easily regenerating the peel layer when the master substrate is reused.

(8) According to another aspect of the Invention, the peel layer is formed to have a thickness of 5 nm to 100 nm. The invention of therefore provides the function of giving so large conductivity as allowing the electrodeposit resin to be electrodeposited to the peel layer made of a fluorocarbon compound with low conductivity as keeping the water-repellency for weakening the bonding force of the electrodeposit resin with the peel layer.

(9) According to another aspect of the invention, there is provided a color filter having the fine pattern manufactured by the method for manufacturing the fine pattern described above, which includes a media substrate made of a flexible and light-transmissive material, a bonding layer made of a light-transmissive material, and electrodeposit resin having a fine pattern of at least two colors. The resulting color filter has a high-definition and high-density fine pattern and is superior in massproductivity.

(10) According to another aspect of the invention, there is provided a shading pattern shaped to an optical encoder scale, the shading pattern made of shading electrodeposit resin and formed on the bonding layer. This shading pattern is served as a color filter as well as an optical encoder scale. The invention of therefore provides the function of realizing the color filter with the optical encoder scale that may be used for a color filter switching system scanner, for example.

(11) According to another aspect of the Invention, there is provided pattern filter having the fine pattern manufactured by the method for manufacturing the fine pattern described in above, which filter includes a media substrate made of a flexible and light-transmissive material, a bonding layer made of a light-transmissive material, and a fine pattern made of light-transmissive electrodeposit resin. The realizing shading pattern filter includes a high-definition and high-density fine pattern and is superior in massproductivity. Further, the invention therefore provides the function of realizing the high-definition and high-density optical encoder scale by simply punching the shading pattern filter.

(12) According to another aspect of the Invention, there is provided a light-transmissive pattern substantially integrated with the shading pattern on the bonding layer and made of light-transmissive electrodeposit resin in the invention described in the immediately preceding paragraph. The light-transmissive pattern substantially integrated with the shading pattern makes it possible to secure larger bonding areas of the shading pattern and the light-transmissive pattern on the bonding layer, thereby enhancing the bonding strength.

(13) According to another aspect of the invention, there is a provided color LCD element which includes a pair of plastic film substrates located as opposed to each other, a transparent pixel electrode formed on the opposed surface of each plastic film substrate, a liquid crystal material sealed between the plastic film substrates, and a color filter located on an outside surface of at least one of the plastic film substrates. The color filter is pasted on the plastic film substrate through a bonding film laid therebetween. It means that the color filter with highly precisely formed pattern is pre-formed on the plastic film substrate. Unlike the prior art, the invention therefore provides the color LCD element that enables to display a highly color-reproducible and high-quality image with no color brightness and unevenness independently of the surface state of the plastic film substrate. Further, the bonding film serves to mitigate the stress caused by the difference of a thermal expansion coefficient between the color filter and the plastic film substrate, thereby suppressing the transformation resulting from the heat of the plastic film substrate.

(14) According to another aspect of the invention, in the invention of the immediately preceding paragraph the bonding film is a reversible bonding film having a base material and bonding layers on both surfaces of the base material. Since the bonding film has a base material, the color filter is made more rigid when the color filter is pasted on the plastic film. The color filter can be pasted on the plastic film more precisely.

(15) According to another aspect of the invention, there is provided a color filter as described in paragraph (9) above, in which either or both of light-storage and fluorescent coloring particles are sealed in the electrodeposit resin layer. For the light-storage coloring particles, their light storage carries color emissions in the dark, while the fluorescent coloring particles offer vivid color emissions with high brightness even in the environment where a light volume is short. Further, if the light-storage coloring particles are mingled with the fluorescent coloring particles, the emissions from the light-storage coloring particles in the dark are received by the fluorescent coloring particles so that the fluorescence allows more brighter and vivid color emissions to be realized.

(16) According to another aspect of the invention, in the invention of the immediately preceding paragraph the coloring particles are composed of transparent resin grains containing light-storage or fluorescent pigment therein. The coloring particles are allowed to be electrodeposited by a water-dispersed electrodeposition bath.

(17) According to another aspect of the invention, the color filter described in any one of paragraphs (15) and (16) above, contains pigment or dye having the same coloring tendency as the coloring particles. The color emissions by light storage of the coloring particles are served as a light source for the pigment or dye so that the emissions prompt the pigment or dye to emit color.

(18) According to another aspect of the invention, there is provided an optical coupling of the color filter and the liquid crystal element described in any one of paragraphs (15)–(17)

above. The coloring function can be continued for a limited duration after the light source or the ambient light disappears. Further, the invention provides a color LCD element that enables to emit a brighter and more vivid color even in the nt where a light volume is short.

(19) According to another aspect of the invention, there is provided a method for manufacturing a fine pattern which comprises the steps of; producing the master substrate by forming an electrode layer patterned to a given form on the substrate; forming a peel layer composed of a water-repellent thin film on the master substrate; impregnating the patterned film with hot water whose temperature ranges from 40° C. to 90° C.; and contacting the patterned film impregnated with hot water and formed on the master substrate with a target substrate, stripping the patterned film off the master substrate and transferring the patterned film onto the media substrate. Hence, since the inside of the patterned film is impregnated with water, the bonding force is weakened by the water-repellency of the peel layer formed on the surface of the master surface. Further, since the surface of the patterned film heated by the hot water is made viscous, the patterned film can be completely and well-reproducibly stripped and transferred onto the media substrate. Moreover, these effects make it possible to easily do the complete strip and transfer. It means that the method may utilize weakly bonded electrodeposit resin, that is, electrodeposit resin that is unlikely to transformable and the complete strip and transfer of the patterned film is made possible as keeping the patterned pattern. This results in suppressing degrade of the patterned film or enhancing the yields, thereby being able to massproduce the high-definition and high-density patterned film inexpensively and reliably.

(20) According to another aspect of the invention, there is provided a step of forming the peel layer of a water-repellent thin film composed of Perfluoro polyether having silicone compound or titanium compound on the master substrate as a terminal group. For example, in the case of using the dip-coating technique, since the terminal group is likely to adhere to the electrode layer or the like formed on the master substrate, the water-repellent thin film composed of Perfluoro polyether with conductivity in liquid because of its thinness may be easily and uniformly formed on the master substrate. Moreover, when reusing the master substrate, the peel layer may be easily reproduced.

(21) According to another aspect of the invention, there is provided inclusion of particles other than the electrodeposit resin in the patterned film formed at the step of forming the patterned film. This invention offers the effect that the patterned film is unlikely to be transformable.

(22) According to another aspect of the invention, there is provided a patterned film formed at the patterning step included in the invention described in paragraph (21) above with variable inclusion of particles other than the electrodeposit resin in the thickness direction. This invention offers the effect that the strong viscosity takes place in the contacting portion between the patterned film and the media substrate and the weak bonding force takes place in the area except the contacting portion so that the patterned film is unlikely to be transformable in that area.

(23) According to another aspect of the invention, there is provided a method for manufacturing a patterned film described in any one of paragraph (19)–(22) above which takes the steps of forming the patterned film stripped and transferred onto the media substrate composed of an insulating substrate and a metallic foil and etching the metallic foil with the patterned film as an etching mask, for the purpose of producing the printed board. This method is superior in massproductivity and may offer an inexpensive printed board.

(24) According to another aspect of the invention, there is provided a method for manufacturing the patterned film described in paragraphs (19)–(22) above which takes the steps of plating a metallic film on the target substrate with the patterned film stripped and transferred onto the target substrate composed of the insulating material as a plating mask, for the purpose of producing the printed board. This method is superior in mass production and may offer a high-definition and high-density printed board at low cost.

Hereafter, the present invention will be described along embodiments with reference to the appended drawings.

Embodiment 1

The description will be oriented to the method for manufacturing a fine pattern according to a first embodiment of the present invention with reference to FIGS. 1 to 4. This embodiment concerns with the color filter used for a color LCD element or the like and presents a description of the method for manufacturing a fine pattern composed of black matrices, red, blue and green filters.

FIG. 1 is a sectional view showing an essential portion of a master substrate obtained at the step of forming a peel layer included in the method for manufacturing a fine pattern according to the first embodiment of the invention. In FIG. 1, a numeral 1 denotes a master substrate. A numeral 2 denotes an insulating substrate. A numeral 3 denotes an electrode for forming a black matrix. A numeral 4 denotes an electrode for forming a red filter. A numeral 5 denotes an electrode for forming a blue filter. A numeral 6 denotes an electrode for forming a green filter. Numerals 7a to 7d denote peel layers. The steps of making the master substrate and forming the peel layer included in the method for manufacturing a fine pattern according to this embodiment will be set forth below with reference to FIG. 1.

At first, in the step of making the master substrate, a metal film such as an Ni-Fe alloy is formed on the insulating substrate 2 made of glass or the like by means of the sputtering technique. The metal film is grown to have a predetermined thickness (300 nm, for example). Next, on the metal film, a positive photo resist is coated to have a thickness of about 2 $\mu$m by means of a spin-coating technique. The photo resist is exposed with a photo mask and then is developed by sodium carbonate aqueous solution for forming a resist pattern of a given shape. With this resist pattern as the etching mask, the metal film is etched by etching liquid such as aqueous solution of nitric acid and acetic acid and then the resist pattern is removed by aqueous solution of sodium hydroxide. These operations result in patterning the metal film to a predetermined shape. As shown in FIG. 1, a patterned electrode layer is formed on the insulating substrate 2. The patterned electrode layer is composed of the electrode 3 for forming the black matrix, the electrode 4 for forming the red filter, the electrode 5 for forming the blue filter, and the electrode 6 for forming the green filter.

Next, as the step of forming a peel layer, as shown in FIG. 1, a peel layer 7a is formed on the electrode 3 for forming the black matrix. A peel layer 7b is formed on the electrode 4 for forming the red filter. A peel layer 7c is formed on the electrode 5 for forming the blue filter. A peel layer 7d is formed on the electrode 6 for forming the green filter. These peel layers 7a to 7d are water-repellent. Each of those peel layers 7a to 7d contains a thin film that is conductive enough to electrodeposit the electrodeposit resin thereon.

The materials for the thin film include metal uch as nickel containing fluororesin particles, fluororesin, and a fluoro-coating agent such as fluorine oil. The metal containing the fluororesin is required to evenly disperse the fluororesin particles in the metal film. Though the fluororesin or the fluoro-coating agent is not so conductive, by adjusting the film thickness in the range of 5 nm to 100 nm, the resulting film is water-repellent and conductive enough to allow for the electrodeposition. In addition, the film of the metal containing the fluoroplastic may be formed by the plating technique. The film of the fluororesin may be formed by the vacuum evaporating technique or the sputtering technique. The film of the fluoro-coating agent may be formed by the coating technique or the dip-coating technique.

In turn, the description will be oriented to the step of making a fine pattern included in the method for manufacturing a fine pattern according to the embodiment of the invention with reference to FIGS. 2A to 2D.

FIGS. 2A to 2D are sectional views showing an essential portion of the master substrate formed at the step of forming the fine pattern included in the method according to the first embodiment of the invention. In FIGS. 2A to 2B, a numeral 8 denotes a black matrix. A numeral 9 denotes a red filter. A numeral 10 denotes a blue filter. A numeral 11 denotes a green filter.

In the step of forming a fine pattern, the fine pattern made of the electrodeposit resin is formed on the peel layers 7a to 7d. At first, the black matrix 8 made of black electrodeposit resin as shown in FIG. 2A is formed on the peel layer 8a shown in FIG. 1 through the use of an acrylic anion electrodeposit resin bath containing black pigment such as carbon black. Next, through the use of the acrylic anion electrodeposit resin bath containing red pigment such as anthraquinone, the red filter 9 made of red electrodeposit resin as shown in FIG. 2B is formed on the peel layer 7b. Next, through the use of the acrylic anion electrodeposit resin bath containing blue pigment such as phthalocyanine blue, the blue filter 10 made of blue electrodeposit resin as shown in FIG. 2C is formed on the peel layer 7c. Further, through the use of the acrylic anion electrodeposit resin bath containing green pigment such as phthalocyanine green, the green filter 11 made of green electrodeposit resin as shown in FIG. 2D is formed on the peel layer 7d. Along those operations, the fine pattern is formed on each of the peel layers 8a to 7d. The fine pattern is composed of the black matrix 8, the red filter 9, the blue filter 10, and the green filter 11, each of which is made of the corresponding color electrodeposit resin. In this step, the density of the pigment in each electrodeposit resin bath is about 30 ml/l, for example and each electrodeposit resin has a thickness of about 2 $\mu$m.

Next, the description will be oriented to the water-impregnating step included in the method for forming a fine pattern according to this embodiment with reference to FIG. 3.

FIG. 3 is a sectional view showing an essential portion of the master substrate indicating the water-impregnating step included in the method for manufacturing a fine pattern according to the first embodiment of the invention. In FIG. 3, a numeral 12 denotes water. In the water-impregnating step, as shown in FIG. 3, for example, by putting the master substrate 1 with the fine pattern formed thereon in the water 12, the black matrices 8 are sufficiently impregnated with water, the red filter 9, the blue filter 10 and the green filter 11 composing the fine pattern. The master substrate 1 is put in water for about one minute. The water has a temperature of 30° C. to 70° C., in particular, about 50° C., which will be discussed below.

The experiment executed by the applicants of the present invention proved the tendency that if the master substrate is impregnated with water of 25° C., the water on the surface of the electrodeposit resin composing the fine pattern is not completely evaporated merely by leaving the water-impregnated substrate so that the master substrate does not have sufficient bonding strength with the bonding layer of the media substrate in the strip and transfer step (to be discussed below). Moreover, the water left on the surface of the electrodeposit resin is tried to be removed by a spongy media. The method of keeping water contained inside of the electrodeposit resin as removing only water left on the surface of the electrodeposit resin of the overall master substrate 1 through the spongy media is disadvantageous in light of reproducibility. It was proved hat the water of such a low temperature may have ifficulty in completely stripping and transferring the fine pattern.

On the other hand, according to the experiment, as the water temperature is raised to 30° C., 40° C., 50° C., 60° C. and 70° C., it is more likelihood that the water left on the surface of the electrodeposit resin is evaporated for removal so that the master substrate can have sufficient bonding strength with the bonding layer of the media substrate and the water impregnated inside of the electrodeposit resin weakens the bonding force of the peel layer with the electrodeposit resin, thereby making it possible to completely stripping and transferring the fine pattern as keeping excellent reproducibility. In particular, when the water temperature is close to 50° C., a good relation appears between the time when the water left on the surface of the electrodeposit resin is evaporated and the time when the water-impregnating step is shifted to the strip and transfer step, so that the waiting time is made shorter. This is more preferable in light of workability.

In the case that the water temperature is 80° C., it was proven the tendency that even the water contained inside of the electrodeposit resin is evaporated, so that the bonding force of the peel layer with the electrodeposit resin is not allowed to be lower to a proper level and thus the complete stripping and transferring of the fine pattern is made difficult. In the case that the water temperature is 25° C. or 80° C., the use of the bonding layer with high bonding strength to be formed on the media substrate makes it possible to strip and transfer the fine pattern but difficult to completely and well reproducibly strip and transfer it. The strip and transfer of the fine pattern to the bond layer with high bonding strength gives a large damage to the master substrate. As a result, the repetitive use of the master substrate is made impossible.

Figure 4A:
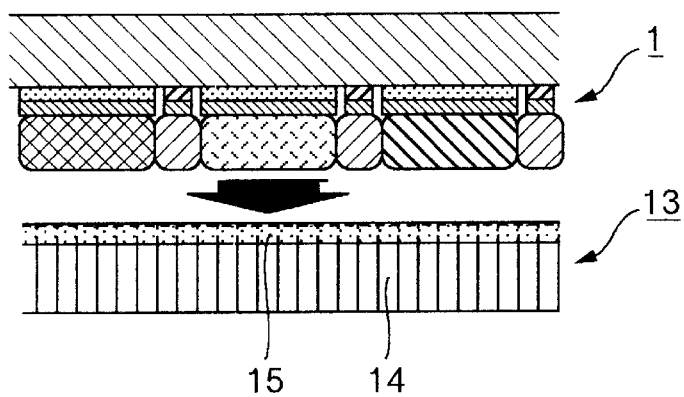
FIG. 4A is a sectional view showing an essential portion of the master substrate and a media substrate for indicating a strip and transfer step included in the method for manufacturing a fine pattern according to the first embodiment of the preset invention.
Figure 4B:
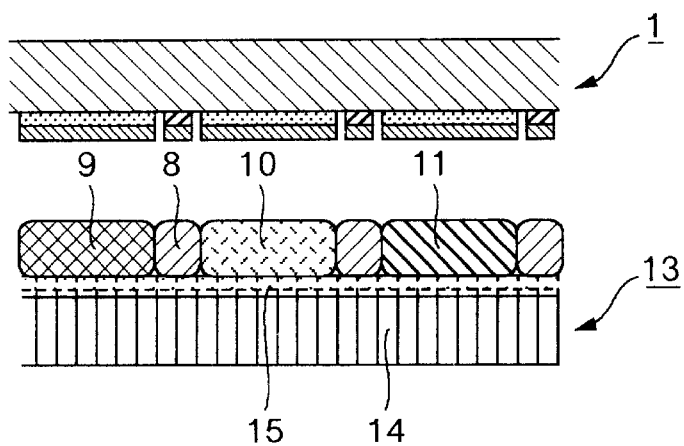
FIG. 4B is a sectional view showing an essential portion of the master substrate and the media substrate for indicating the strip and transfer step in the method for manufacturing a fine pattern according to the first embodiment of the preset invention.

In turn, the description will be oriented to the step of stripping and transferring the fine pattern included in the method for forming a fine pattern according to the embodiment with reference to FIGS. 4A and 4B.

FIGS. 4A and 4B are sectional views of an essential portion of the master substrate and the media substrate for indicating the strip and transfer step included in the method for manufacturing a fine pattern according to the first embodiment of the present invention. In FIGS. 4A and 4B, a numeral 13 denotes a media substrate. A numeral 14 denotes a substrate main body. A numeral 15 denotes a bonding layer.

In the strip and transfer step, the fine pattern composed of the electrodeposit resin whose bonding force is weakened at the water-impregnating step is stripped off the master substrate 1 and transferred onto the bonding layer 15 of the media substrate 13. The media substrate 13 used at the strip and transfer step is composed of the substrate main body 14 and the bonding layer 15 formed on the substrate main body 14 as shown in FIG. 4A. The color filter referred to as an example in this embodiment utilizes a flexible and light-transmissive substrate made of polyethylene terephthalate (abbreviated as PET) as the substrate main body 14, on which an acrylic adhesive agent with light transmission is coated as the bonding layer 15 by means of the roll-coat technique. The resulting substrate is made to be the media substrate 13.

The resulting media substrate 13 is bonded with and pressurized against the master substrate 1 in the direction as shown in FIG. 4A. Then, both of the substrates are stripped off each other. As a result, the fine pattern composed of the black matrices 8, the red filters 9, the blue filters 10, and the green filters 11 as shown in FIG. 4B is stripped off the master substrate 1 and then transferred onto the media substrate 13.

After the strip and transfer step, by heating and drying the media substrate 13 at a temperature of 140° C. for about thirty minutes, it is possible to form the high-definition and high-density color filter provided with the substantially planar fine pattern. In addition, the master substrate after the strip and transfer step can be reused in the steps later than the step of forming the fine pattern.

The color filter according to this embodiment includes the fine pattern formed at high definition and high density and is superior in massproductivity. The color filter also includes a flexible substrate. The color filter pasted on the LCD element or the element of an image sensor or a scanner thus makes it possible to easily implement a color-emitting function. The color filter of this embodiment may take a composition that the media substrate 13 obtained by the foregoing method is pasted on a rigid light-transmissive substrate made of glass according to the way of use.

As set forth above, according to this embodiment, by water-impregnating the inside of the electrodeposit resin having the peel layer formed of a water-repellent thin film on which the fine pattern is formed, it is possible to remarkably weaken the bonding force of the electrodeposit resin with the peel layer and reliably and completely strip the fine pattern off the master substrate and transfer the fine pattern onto the bonding layer of the media substrate.

The strip and transfer is carried out in the state that the bonding force of the electrodeposit resin with the peel layer is remarkably weakened. Hence, no damage is given to the peel layer and the patterned electrode layer of the master substrate when stripping and transferring the fine pattern. Further, the similarly shaped fine pattern can be formed on the same master substrate with excellent reproducibility, the repetitive use of the master substrate is made possible, and the life of the master substrate can be extended.

Since the bonding force of the electrodeposit resin with the peel layer can be weakened, the media substrate may contain a bonding layer with weak bonding strength. Moreover, since the weakened bonding force does not need to forcibly strip the master substrate off the media substrate, this serves to prevent the fine pattern from being misshaped and damaged.

At the water-impregnating step, by impregnating the mater substrate with a hot water of 30° C. to 70° C., preferably, about 50° C., the water impregnation into the inside of the electrodeposit resin is made possible as the water on the surface of the electrodeposit resin composing the fine pattern is progressively evaporated. This makes it possible to more easily strip the fine pattern off the master substrate and improve the bonding characteristic of the fine pattern onto the media substrate.

With the aforementioned function, the pattern-formed electrode can be quite densely formed on the master substrate through the use of the photolithograph technique. Hence, the high-definition and high-density fine pattern is allowed to be easily produced with excellent massproductivity.

The foregoing embodiment has been described with respect to the color filter provided with the fine patterns formed of the electrodeposit resins of four colors. In actual, however, the type and the number of the electrodeposit resins are not limited. Moreover, if the times of the repetitive use of the master substrate are increased, the bonding characteristic between the peel layer and the patterned electrode layer is made so low that the peel layer bonded with the electrodeposit resin may be transferred at the strip and transfer step. Hence, it is preferable to reproduce the peel layer if necessary. In actual, however, according to this embodiment, if the peel layer bonded with the electrodeposit resin takes place at this step as mentioned above, the peel layer is allowed to be substantially removed. Further, even if part of the peel layer is left without being removed, the thickness of the left peel layer is so thin that the optical effect given by the left peel layer is negligible. In light of the endurance of the peel layer, the film of the fluoro-coating agent is superior to the film of the metal film containing the fluororesin or the film of the fluoro-resin. The fluoro-coating agent can be quite easily formed on the master substrate by means of the dip-coating technique. In the case of repetitively using the maser substrate, the fluoro-coating agent may be coated every time after the strip and transfer operation so that the peel layers may be piled on the master substrate.

Embodiment 2

Figure 5A:
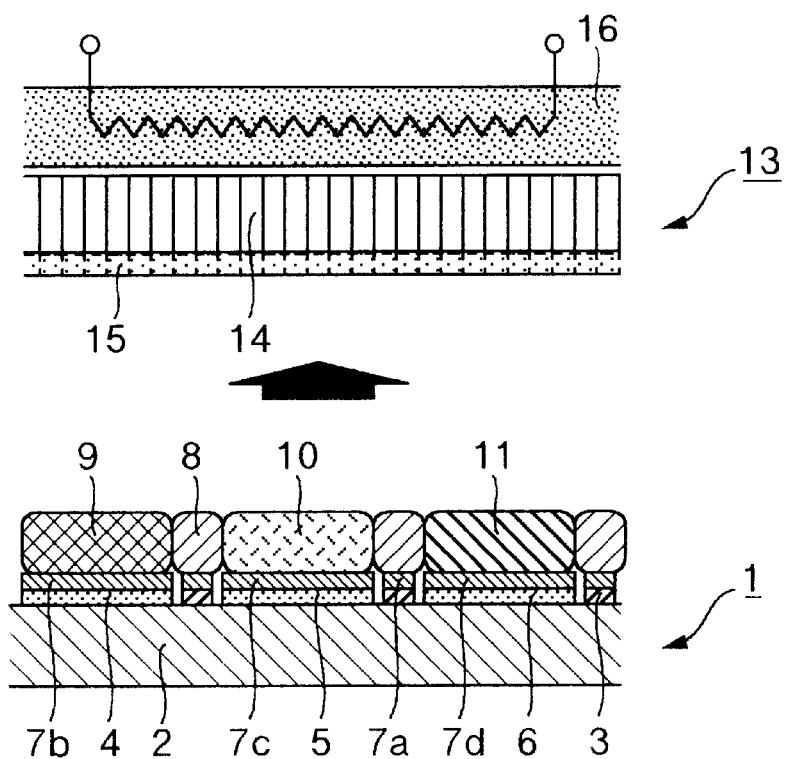
FIG. 5A is a sectional view showing an essential portion of the master substrate and the media substrate for indicating the strip and transfer step in the method for manufacturing a fine pattern according to the second embodiment of the preset invention.
Figure 5B:
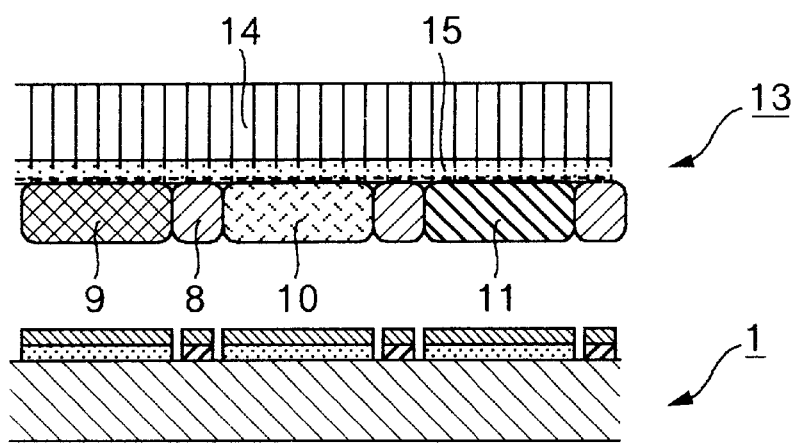
FIG. 5B is a sectional view showing an essential portion of the master substrate and the media substrate for indicating the strip and transfer step in the method for manufacturing a fine pattern according to the second embodiment of the preset invention.

The method for manufacturing a fine pattern according to a second embodiment of the invention will be described with reference to FIGS. 5A and 5B. The manufacturing method of this embodiment is likewise to that of the first embodiment except the strip and transfer step. The following description will concern with formation of the fine pattern of the color filter according to the first embodiment of the invention. FIGS. 5A and 5B are sectional views of the essential portions of the master substrate and the media substrate for indicating the strip and transfer step included in the method for manufacturing the fine pattern according to the second embodiment of the invention. In FIGS. 5A and 5SB, a numeral 16 denotes a heater. A master substrate 1, an insulating substrate 2, an electrode 3 for forming black matrices, an electrode 4 for forming a red filter, an electrode 5 for forming a blue filter, an electrode 6 for forming a green filter, peel layers 7a to 7d, a black matrix 8, a red filter 9, a blue filter 10, a green filter 11, a media substrate 13, a substrate main body 14, and a bonding layer 15 are the same as those of the first embodiment. Hence, those components have like reference numbers and are not described hereafter.

At the strip and transfer step included in the method for manufacturing a fine pattern, when the media substrate 13 is heated up to about 50° C. by the heater 16, through the step of forming the master substrate, the step of forming the peel layer, the step of forming the fine pattern, and the step of impregnating the substrate with water, the master substrate 1 is composed to have the fine pattern made of the electrodeposit resin and the bonding force of the electrodeposit resin is weakened. The resulting master substrate 1 is pressurized and bonded on the media substrate 13 in the direction shown in FIG. 5A. Then, the media substrate 13 is stripped from the master substrate 1. As shown in FIG. 5B, the fine pattern composed of the black matrices 8, the red filters 9, the blue filters 10, and the green filters 11 is stripped off the master substrate 1 and then is transferred onto the bonding layer 15 of the media substrate 13. As noted above, since the media substrate 13 is heated, at the strip and transfer, the water on the surface of the electrodeposit resin composing the fine pattern is allowed to be quickly evaporated.

After the strip and transfer step, by heating and drying the media substrate 13 at 140° C. for 30 minutes, it is possible to manufacture the high-definition and high-density color filter whose fine pattern surface is substantially planar. After this step, the master substrate may be repetitively used in the process after the step of forming the fine pattern.

As set forth above, the method of this embodiment offers the similar effect to that of the first embodiment. By heating the media substrate, it is possible to quickly evaporate the water left on the surface of the electrodeposit resin composing the fine pattern when stripping and transferring the fine pattern. This therefore makes it possible to improve the bonding characteristic between the bonding layer of the media substrate and the electrodeposit resin and shorten the waiting time between the water-impregnating step and the strip and transfer step.

The temperature of the water with which the master substrate is to be impregnated at the water-impregnating step is preferably limited upwards to 70° C. on the grounds that have been described with respect to the first embodiment. The lower temperature is not specifially limited to 30° C. or more. However, it is preferable limit it as 15° C. or more in consideration of the workability of impregnating the inside of the electrodeposit resin with water.

Embodiment 3

The method for manufacturing a fine pattern according to a third embodiment of the invention will be described with reference to FIGS. 6A and 6B. This manufacturing method of this embodiment is likewise to that of the first embodiment except the strip and transfer step. This method will be described along the formation of the fine pattern of the color filter indicated in the first embodiment of the invention.

Figure 6A:
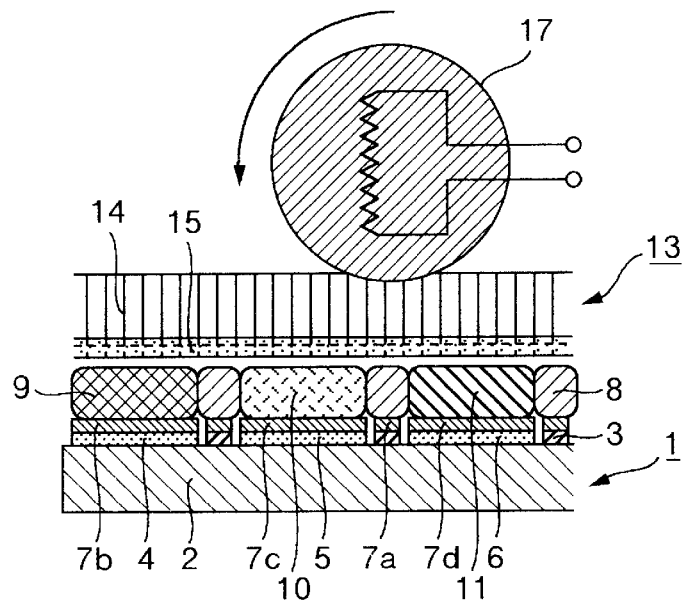
FIG. 6A is a sectional view showing an essential portion of a master substrate and a media substrate for indicating the strip and transfer step in the method for manufacturing a fine pattern according to a third embodiment of the preset invention.
Figure 6B:
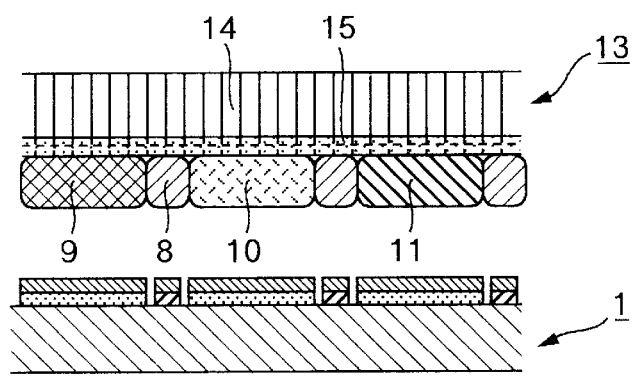
FIG. 6B is a sectional view showing an essential portion of the master substrate and the media substrate for indicating the strip and transfer step in the method for manufacturing a fine pattern according to the third embodiment of the preset invention.

FIGS. 6A and 6B are sectional views of essential portions of a master substrate and a media substrate for indicating the strip and transfer step included in the method for manufacturing a fine pattern according to the third embodiment of the invention. In FIGS. 6A and 6B, a numeral 17 denotes a heating and pressurizing roller. A master substrate 1, an insulating substrate 2, an electrode 3 for forming black matrices, an electrode 4 for forming a red filter, an electrode 5 for forming a blue filter, an electrode 6 for forming a green filter, peel layers 7a to 7d, a black matrix 8, a red filter 9, a blue filter 10, a green filter 11, a media substrate 13, a substrate main body 14, and a bonding layer 15 are the same as those of the first embodiment. Hence, they have like reference numbers and are not described hereafter.

As shown in FIG. 6A, at the strip and transfer step included in the method for manufacturing a fine pattern according to this embodiment, through the step of forming a master substrate, the step of forming the peel layer, the step of forming the fine pattern, and the step of impregnating the master substrate with water, the maser substrate 1 is composed to have the fine pattern made of the electrodeposit resin and the bonding force of the electrodeposit resin is weakened. The resulting mastrer substrate 1 is allowed to come into contact with the media substrate 13 as shown in FIG. 6A. Then, both of the substrates are heated and pressurized by the heating and pressurizing roller 17. The most preferable heatging temperature is about 50° C. Then, the master substrate 1 is stripped from the media substrate 13. As a result, as shown in FIG. 6B, the fine pattern composed of the black matrices 8, the red filters 9, the blue filters 10, and the green filters, which is formed on the master substrate 1, is stripped and transferred on the bonding layer 15 of the media substrate 13.

After the strip and transfer step, by drying and heating the media substrate 13 at 140° C. for about 30 minutes, it is possible to manufacture a high-definition and high-density color filter whose fine pattern surface is substantially planar. After the strip and transfer step, the master substrate may be repetitively used in the process after the step of forming the fine pattern.

As set forth above, this embodiment offers the same effects as the first embodiment. At the strip and transfer step, the wate left on the surface of the electrodeposit resin composing the fine pattern is allowed to be quickly evaporated by heating. This makes it possible to improve the bonding characteristic between the bonding layer of the media substrate and the electrodeposit resin and shorten the waiting time between the water-impregnating step and the strip and transfer step. By heating as well as pressurizing both of the substrates, a high bonding characteristic between the bonding layer and the electrodeposit resin can be obtained for a short time.

The temperature of the water with which the master substrate is impregnated is preferably 15° C. to 17° C. on the grounds that have been described with respect to the second embodiment.

Embodiment 4

The method for manufacturing a fine pattern according to a fourth embodiment of the invention will be described with reference to FIGS. 7 to 11. The present description will be described along the method for manufacturing the fine pattern made of shading electrodeposit resin with an example of a shading pattern filter used for an optical encoder scale.

Figure 7:
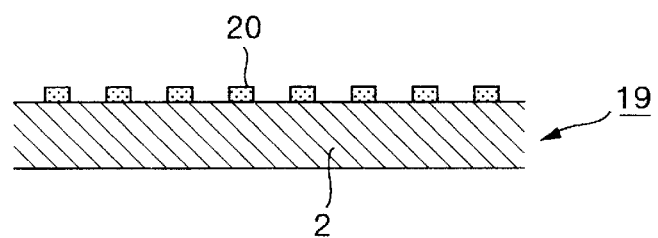
FIG. 7 is a sectional view showing an essential portion of a master substrate formed at a step of making a master substrate included in the method for manufacturing a fine pattern according to a fourth embodiment of the invention.
Figure 8:
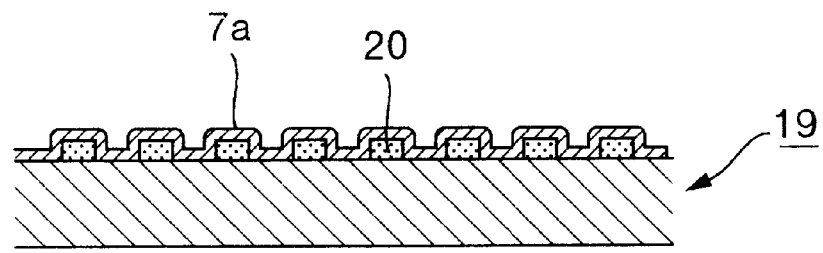
FIG. 8 is a sectional view showing an essential portion of the master substrate formed at a step of stripping and transferring a master substrate included in the method for manufacturing a fine pattern according to the fourth embodiment of the invention.

FIG. 7 is a sectional view showing an essential portion of the master substrate obtained at the step of forming the master substrate included in the method for manufacturing the fine pattern according to the fourth embodiment. FIG. 8 is a sectional view showing an essential portion of the master substrate obtained at the step of forming the peel layer included in the method. In FIGS. 7 and 8, a numeral 10 denotes the master substrate. A numeral 20 denotes an electrode for forming a shading pattern. An insulating substrate 2 and a peel layer 7a are the same as those of the first embodiment. Hence, they have like reference number and will not be described hereafter.

At the step of forming the master substrate included in the method according to this embodiment, like the first embodiment, a metal film made of an Ni-Fe alloy, for example, formed on the insulating substrate 2 is etched into a predetermined pattern by means of the photolithograph technique. The resulting master substrate 19 includes on the insulating substrate 2 the electrode 20 for forming the shading pattern as shown in FIG. 7 as a patterned electrode layer.

Next, at the step of forming the peel layer, like the first embodiment, as shown in FIG. 8, the peel layer 7a made of a conductive water-repellent thin film is formed on the electrode 20 for forming the shading pattern of the master substrate 19. The peel layer 7a is formed of metal such as nickel containing fluororesin particles, fluororesin, or a fluoro-coating system such as fluorine oil. As an example, consider that the peel layer 8a is formed of fluorine oil. In this case, the master substrate 19 is dipped in a solution in which the fluorine oil is diluted by a solvent such as isopropyl alcohol. Then, the master substrate 19 is pulled out of the solution at as slow a speed as 10 mm/minute or some. Next, the master substrate 19 is dried. The resulting master substrate 19 has a water-repellent even peel layer 7a with a thickness of 15 nm and a contact angle of 100°.

Figure 9:
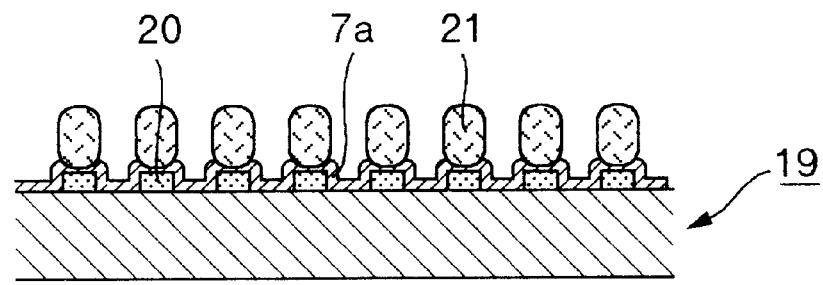
FIG. 9 is a sectional view showing an essential portion of the master substrate formed at a step of forming a fine pattern included in the method for manufacturing a fine pattern according to the fourth embodiment of the invention.

In turn, the description will be oriented to the step of forming the fine pattern included in the method of this embodiment with reference to FIG. 9.

FIG. 9 is a sectional view showing an essential portion of the master substrate obtained at the step of forming the fine pattern. In FIG. 9, a numeral 21 denotes a shading pattern.

At this step, the fine pattern made of the electrodeposit resin is formed on the peel layer 7a. In this embodiment, for forming the shading fine pattern, the shading pattern 21 made of black electrodeposit resin as shown in FIG. 9 is formed on the peel layer 7a on the electrode 20 for forming the shading pattern shown in FIG. 8 through the use of an acrylic anion electrodeposit resin bath containing black pigment such as carbon black. The density of the pigment in the electrodeposit resin bath and the thickness of the electrodeposit are the same as those described with respect to the first embodiment. They are left off this description.

Figure 10:
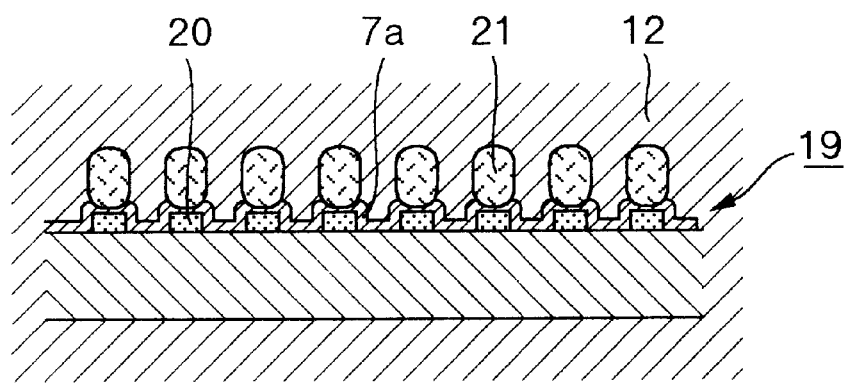
FIG. 10 is a sectional view showing an essential portion of the master substrate for indicating a water-impregnating step included in the method for manufacturing a fine pattern according to the fourth embodiment of the invention.

Next, the description will be oriented to the step of impregnating the master substrate with water included in the method of the fourth embodiment with reference to FIG. 10.

FIG. 10 is a sectional view showing an essential portion of the master substrate for indicating the water-impregnating step. In FIG. 10, the water 12 is the same as that of the first embodiment. Hence, it has a like reference number and is not described hereafter.

The water-impregnating step included in this embodiment is likewise to that of the first embodiment. As shown in FIG. 10, by dipping the master substrate 19 having the shading pattern 21 formed thereon in the water 12, the electrodeposit resin composing the shading pattern 21 is sufficiently impregnated with water. The impregnating time is about one minute. The temperature of the water 12 is, preferably, 30° C. to 70° C. at the strip and transfer step if no heat and pressure are applied to the substrates like the first embodiment, while the temperature of the water 12 is, preferably, 15° C. to 70° C. if the heat and pressure are applied to the substrates like the second and the third embodiments.

Next, the description will be oriented to the strip and transfer step included in the method of this embodiment. The strip and transfer step of this embodiment may take any one of those of the first to the third embodiments. Herein, as an example, the strip and transfer step of the first embodiment is taken for describing the method.

Figure 11A:
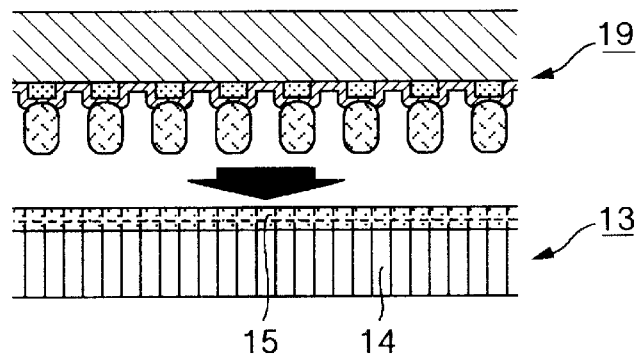
FIG. 11A is a sectional view showing an essential portion of the master substrate and the media substrate for indicating the strip and transfer step included in the method for manufacturing a fine pattern according to the fourth embodiment of the invention.
Figure 11B:
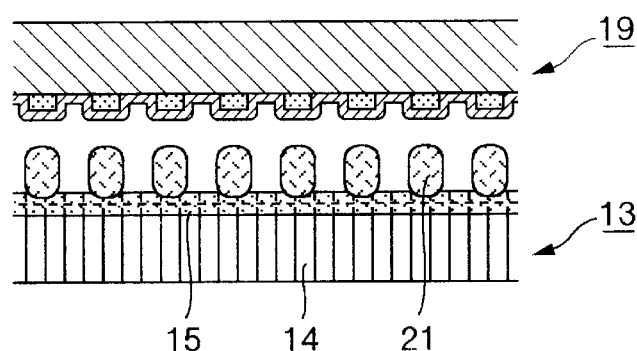
FIG. 11B is a sectional view showing an essential portion of the master substrate and the media substrate for indicating the strip and transfer step included in the method for manufacturing a fine pattern according to the fourth embodiment of the invention.

FIGS. 11A and 11B are sectional views showing essential portions of the master substrate and the media substrate for indicating the strip and transfer step included in the method for manufacturing a fine pattern according to the fourth embodiment of the invention. In FIGS. 11A and 11B, a media substrate 13, a substrate main body 14, and a bonding layer 15 are the same as those of the first embodiment. Hence, they have like reference numbers and are not described hereafter.

At the strip and transfer step, the media substrate 13 is put into contact with the master substrate 19 in the direction shown in FIG. 11A. Then, both of the substrates are pressurized against each other. Next, the media substrate 13 is stripped from the master substrate 19. The resulting media substrate 13 contains the shading pattern 21 stripped off the master substrate 1 and transferred onto the bonding layer 15 of the media substrate 13 itself as shown in FIG. 11B.

After the strip and transfer step, by heating and drying the media substrate 13 at 140° C. for about 30 minutes, it is possible to produce the high-definition and high-density shading pattern. After the strip and transfer step, the master substrate may be repetitively used in the process after the step of forming the fine pattern.

The shading pattern filter obtained according to this embodiment contains the shading pattern formed at high definition and high density and is superior in massproductivity. Further, the shading pattern filter is composed of a flexible substrate so that it may be pasted on any material and easily punched. By punching the shading pattern filter, it is possible to provide the high-definition and high-density optical encoder scale. In addition, the shading pattern filter obtained according to this embodiment is punched as mentioned above and then the media substrate 13 may be pasted on the rigid light-transmissive substrate made of glass with a light-transmissive bonding layer laid therebetween.

As set forth above, this embodiment offers the same effect as the first embodiment. By heading or heating and pressurizing at the strip and transfer step, this embodiment offers the same effect as the second or the third embodiment.

Embodiment 5

The description will be oriented to the method for manufacturing a fine pattern according to a fifth embodiment of the invention with reference to FIGS. 12 to 16. The present embodiment will be described along the information of the fine pattern made of the shading electrodeposit resin and light-transmissive electrodeposit resin with an example of the shading pattern filter used for the optical encoder scale, for example.

Figure 12:
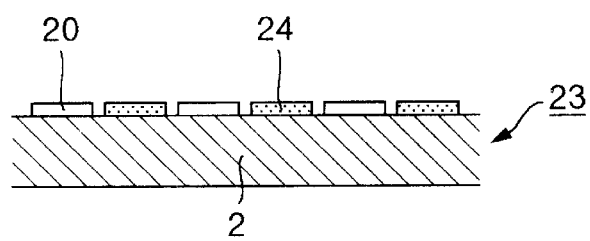
FIG. 12 is a sectional view showing an essential portion of a master substrate formed at a step of making the master substrate included in the method for manufacturing a fine pattern according to a fifth embodiment of the invention.
Figure 13:
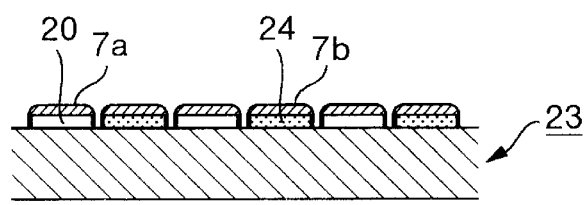
FIG. 13 is a sectional view showing an essential portion of the master substrate formed at the strip and transfer step included in the method for manufacturing a fine pattern according to the fifth embodiment of the invention.

FIG. 12 is a sectional view showing an essential portion of the master substrate obtained at the step of forming the master substrate included in the method according to this embodiment. FIG. 13 is a sectional view showing an essential portion of the master substrate obtained at the step of forming the peel layer included in the method according to this embodiment. In FIGS. 12 and 13, a numeral 23 denotes a master substrate. A numeral 24 denotes an electrode for forming a light-transmissive pattern. An insulating substrate 2, peel layers 7a and 7b, and an electrode 20 for forming a shading pattern are the same as those of the first or the fourth embodiment. Hence, those components have the same reference numbers and will not be described hereafter. At the step of forming the master substrate included in the method of this embodiment, like the first embodiment, a metal film made of an Ni-Fe alloy, for example, formed on the insulating substrate 2 is etched into a predetermined pattern by means of the photolithograph technique. The resulting master substrate 23 includes on the insulating substrate 2 the electrode 20 for forming the shading pattern and the electrode 24 for forming the light-transmissive pattern as shown in FIG. 12 as the patterned electrode layer.

Next, at the step of forming the peel layer, like the first embodiment, as shown in FIG. 13, the water-repellent conductive peel layers 7a and 7b are formed on the electrodes 20 and 24 of the master substrate 23. The materials and the forming method of the peel layers 7a and 7b are the same as those of the first and the fourth embodiments. Hence, they are not described herein.

Figure 14:
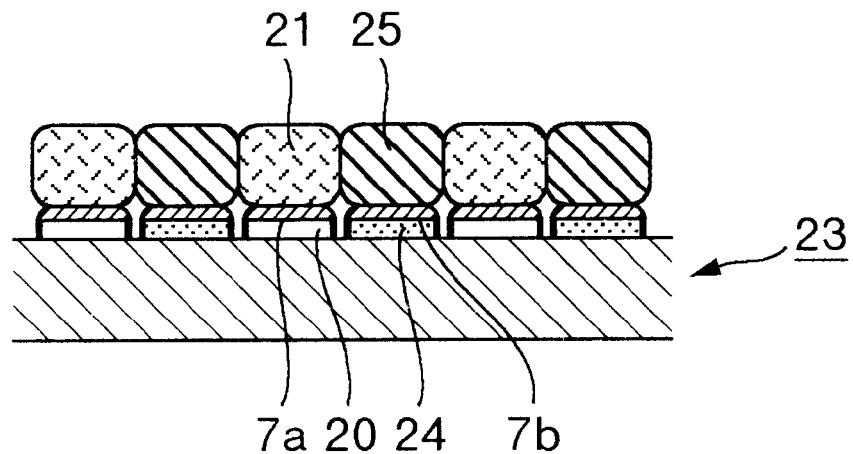
FIG. 14 is a sectional view showing an essential portion of the master substrate formed at the step of forming a fine pattern included in the method for manufacturing a fine pattern according to the fifth embodiment of the invention.

In turn, the description will be oriented to the step of forming the fine pattern included in the method of this embodiment with reference to FIG. 14.

FIG. 14 is a sectional view showing an essential portion of the master substrate obtained at the step of forming the fine pattern. In FIG. 14, a numeral 25 denotes a light-transmissive pattern. A shading pattern 21 used at this step is the same as that of the fourth embodiment. Hence, it has a like reference number and is not described herein.

At the step of forming the fine pattern, the fine pattern made of electrodeposit resin is formed on the peel layers 7a and 7b. In this embodiment, as shown in FIG. 14, the shading pattern 21 made of black electrodeposit resin is formed on the peel layer 7a of the electrode 20 for forming the shading pattern. Then, the light-transmissive pattern made of light-transmissive electrodeposit resin is formed on the peel layer 7b of the electrode 24 for forming the light-transmissive pattern through the use of the acrylic anion electrodeposit resin bath excluding pigment. The density of pigment in the electrodeposit resin bath and the thickness of the electrodeposit resin are the same as those of the first embodiment. Hence, they are not described herein.

Figure 15:
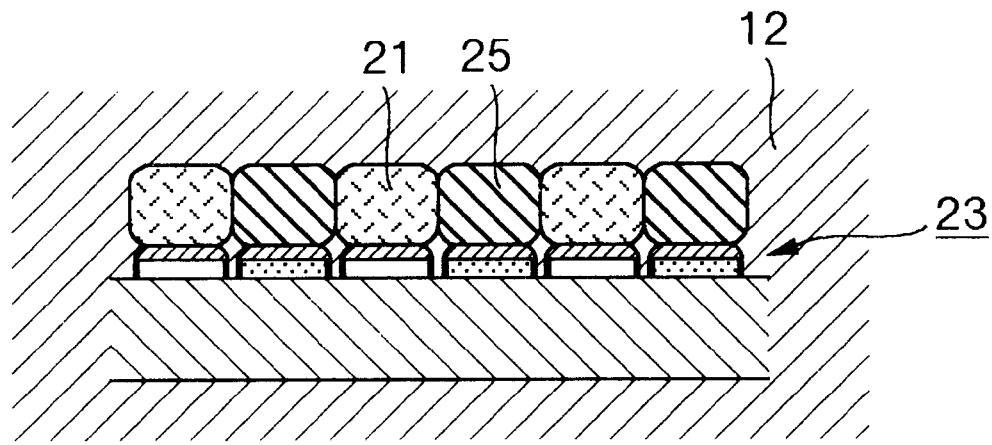
FIG. 15 is a sectional view showing an essential portion of the master substrate for indicating a water-impregnating step included in the method for manufacturing a fine pattern according to the fifth embodiment of the invention.

In turn, the description will be oriented to the water-impregnating step included in the method of this embodiment with reference to FIG. 15.

FIG. 15 is a sectional view showing an essential portion of the master substrate for indicating the water-impregnating step included in the method according to the fifth embodiment. In FIG. 15, water 12 is the same as that of the first embodiment. Hence, it has a like reference number and will not be described hereafter.

The water-impregnating step of this embodiment is the same as that of the first embodiment. As shown in FIG. 15, by dipping the master substrate 23 having the fine pattern formed thereon in the water 12, the electrodeposit resin composing the shading pattern 21 and the light-transmissive pattern 25 is sufficiently impregnated with the water. The dipping time is about one minute. The temperature of the water 12 is, preferably, 30° C. to 70° C. if no heat and pressure are applied to the substrates at the strip and transfer step (to be described below) like the first embodiment, while the temperature of the water 12 is, preferably, 15° C. to 70° C. if the substrates are heated and pressurized against each other at the strip and transfer step like the second or the third embodiment.

Next, the description will be oriented to the strip and transfer step included in the method according to this embodiment. The strip and transfer step of this embodiment may take any one of the strip and transfer steps of the first to the third embodiments. Herein, the transfer and strip step of the first embodiment is taken as an example for the purpose of describing this method.

Figure 16A:
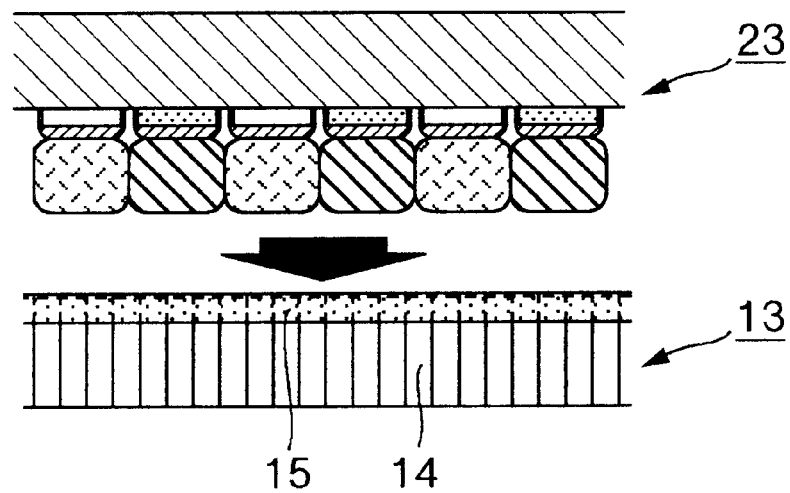
FIG. 16A is a sectional view showing an essential portion of the master substrate and a media substrate for indicating a strip and transfer step included in the method for manufacturing a fine pattern according to the fifth embodiment of the invention.
Figure 16B:
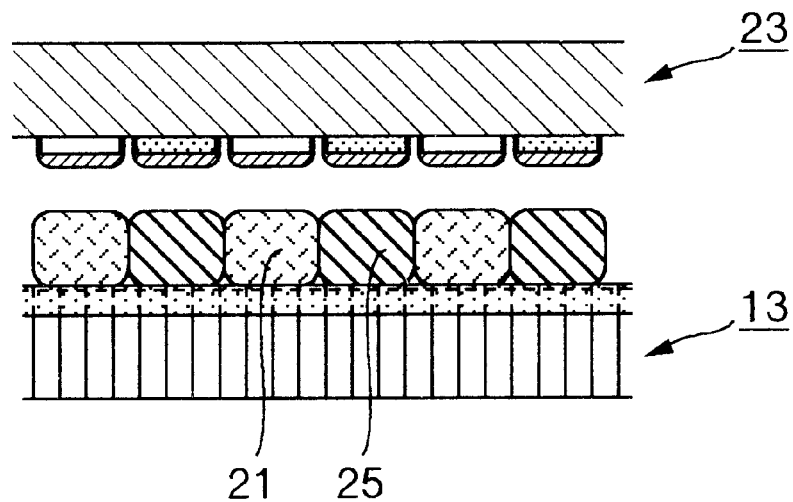
FIG. 16B is a sectional view showing an essential portion of the master substrate and the media substrate for indicating the strip and transfer step included in the method for manufacturing a fine pattern according to the fifth embodiment of the invention.

FIGS. 16A and 16B are sectional views showing an master substrate and a media substrate for indicating the strip and transfer step included in the method according to the fifth embodiment. In FIGS. 15A and 16B, a media substrate 13, a substrate main body 14, and a bonding layer are the same as those of the first embodiment. Hence, they have like reference numbers and will not be not described hereafter.

At the strip and transfer step, the media substrate 13 is put into contact with the master substrate 23 in the direction shown in FIG. 16A and both of the substrates are pressurized against each other. Both of the substrates are stripped from each other. As a result, as shown in FIG. 16B, the shading pattern 21 and the light-transmissive pattern 25 are stripped off the master substrate 23 and then transferred on the bonding layer 15 of the media substrate 13.

After the strip and transfer step, by heating and drying the media substrate 13 at 140° C. for about 30 minutes, the resulting media substrate 13 includes a high-definition and high-density shading pattern and light-transmissive pattern whose fine pattern surface is substantially planar.

The shading pattern filter obtained by the method of this embodiment includes the shading pattern and the light-transmissive pattern formed at high definition and high density and is superior in massproductivity. As compared with the shading pattern filter obtained by the method of the fourth embodiment, since the shading pattern substantially integrated with the light-transmissive pattern are stripped and transferred, this pattern filter secures a wider bonding area with the bonding layer so that the bonding strength of the patterns may be enhanced. Moreover, the shading pattern filter uses a flexible substrate. Hence, the filter may be pasted on any material and easily punched. Simply by punching the shading pattern filter, it is possible to provide a high-definition and high-density optical encoder scale.

As set forth above, the present embodiment offers the same effect as the first embodiment. Further, by heating or heating and pressurizing the substrates against each other at the strip and transfer step, the first embodiment offers the same effect as the second or the third embodiment.

Embodiment 6

Figure 17:
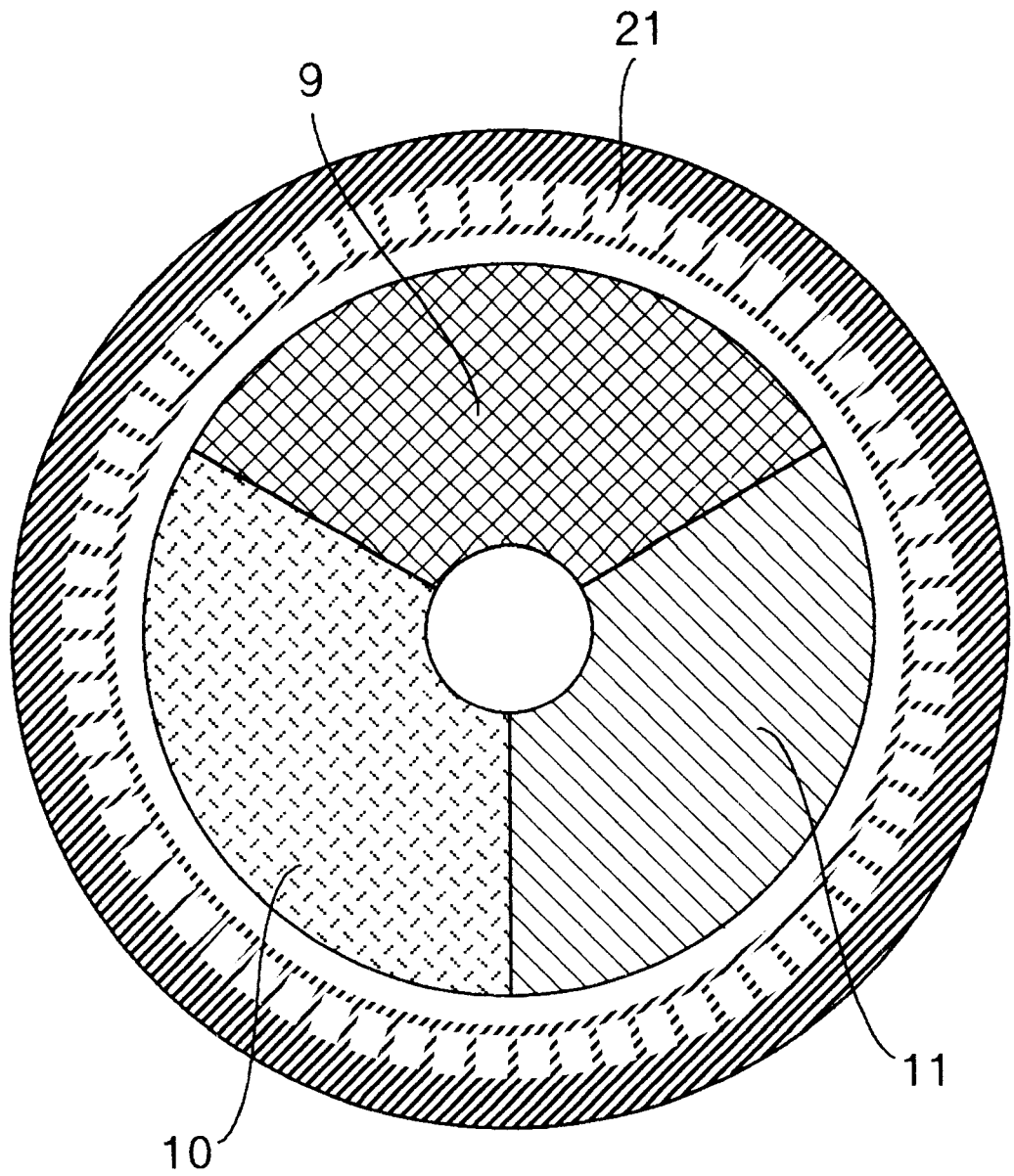
FIG. 17 is a plane view showing a color filter according to a sixth embodiment of the present invention.

FIG. 17 is a plane view showing a color filter according to a sixth embodiment of the invention. In FIG. 17, a red filter 9, a blue filter 10, and a green filter 11 of this embodiment are the same as those of the first embodiment. A shading pattern 21 is the same as that of the fourth embodiment. Those components have like reference numbers. Hence, they will not be described hereafter.

The color filter of this embodiment is likewise to that of the first embodiment except that as shown in FIG. 17 the red filter 9, the blue filter 10, the green filter as well as the shading pattern 21 are formed on the light-transmissive bonding layer (not shown) formed on the flexible light-transmissive substrate (not shown).

The color filter of this embodiment can be manufactured by the similar method to the first embodiment. Concretely, at the step of forming the patterned electrode layer, the operation is executed to form the electrodes corresponding to the red filter 9, the blue filter 10, the green filter 11 and the shading pattern 21.

As described above, the color filter of this embodiment provides a color-filtering function and the shading pattern shaped to the optical encoder scale. Hence, the resulting color filter provides an optical encoder scale that may be used for a color switching system scanner, for example.

Embodiment 7

Figure 18:
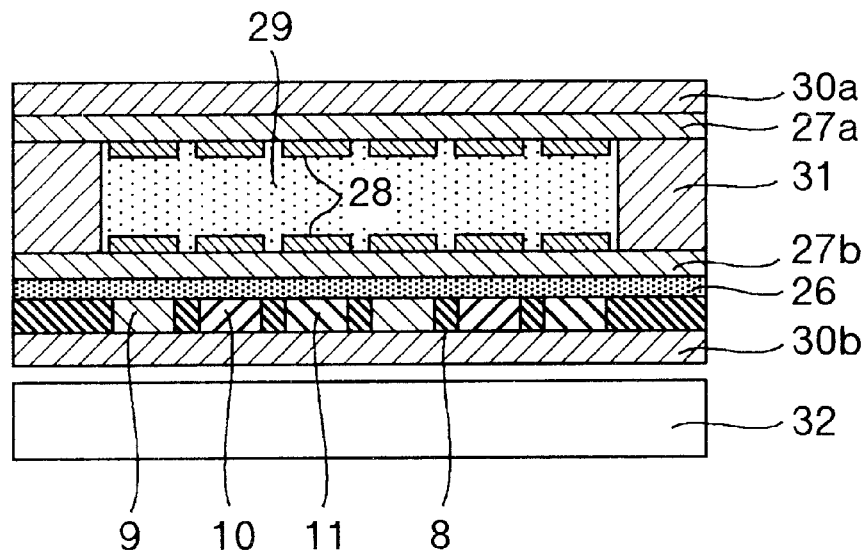
FIG. 18 is a sectional view showing an essential portion of a color liquid crystal display element according to a seventh embodiment of the present invention.

FIG. 18 is a sectional view showing an essential portion of the color LCD element according to a seventh embodiment of the invention. In FIG. 18, a numeral 26 denotes a bonding film. Numerals 27a and 27b denote a plastic film substrate. There are illustrated a transparent pixel electrode 28, a liquid crystal material 29, polarizing plates 30a, 30b, a sealing member 31, and a light source 32. The illustrative black matrices 8, red filter 9, blue filter 10 and green filter 11 are the same as those of the first embodiment. Hence, those components have like reference numbers and will not be described hereafter.

The color filter of this embodiment can be manufactured by the similar method to the first embodiment. Concretely, at the strip and transfer step, the color filter utilizes the bonding film 26 as the media substrate on which the fine pattern is stripped off the master substrate and transferred.

The bonding film 26 is a double-sided bonding film composed of a media substrate made of polyethylene terephthalate and bonding layers formed on both sides of the media substrate. In place, the bonding film 26 may be composed of the bonding layer only.

The different respect of the color LCD element of this embodiment from the conventional LCD element is that a color filter composed of the black matrices 8, the red filters 9, the blue filters 10 and the green filters 11 is pasted on one surface of the plastic film substrate 27b on the other surface of which the transparent pixel electrode 28 is formed with the bonding film 26 laid between the surface of the substrate 27b and the color filter itself.

As mentioned above, the plastic film substrate includes a precisely pattern-formed pre-manufactured color filter on the plastic film substrate. Unlike the prior art, the resulting color LCD element has an independent characteristic of the surface state of the plastic film substrate, no color or brightness unevenness on the display screen, and superior color reproducibility and thus outputs a high-quality image. Further, the bonding film serves to mitigate the stress caused by the difference of a thermal expansion coefficient between the color filter and the plastic film substrate and suppress the thermal transformation of the plastic film substrate.

Embodiment 8

Figure 19:
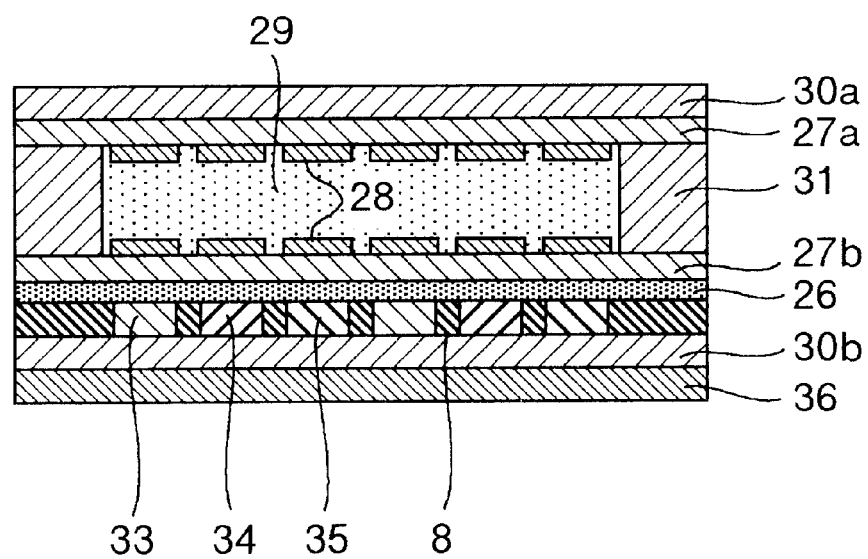
FIG. 19 is a sectional view showing an essential portion of a color liquid crystal display element according to an eighth embodiment of the present invention.

FIG. 19 is a sectional view showing an essential portion of a reflective color LCD element according to an eighth embodiment of the invention. In FIG. 19, a numeral 33 denotes a red-emission filter, A numeral 34 denotes a blue-emission filter. A numeral 35 denotes a green-emission filter. A numeral 36 denotes a reflection plate. The illustrative black matrices 8, bonding film 26, plastic film substrates 27a and 27b, transparent pixel electrode 28, liquid crystal material 29, polarizing plates 30a and 30b, and sealing member 31 are the same as those of the first and the seventh embodiments. Hence, those components have like reference numbers and will not be described hereafter.

The color filter of this embodiment can be manufactured by the similar method to the first embodiment. Concretely, at the step of forming a fine pattern, the black matrices 8, the red-emission, the blue-emission and the green-emission filters 33, 34 and 35 are electrodeposited on the master substrate 1.

That is, in the formation of the black matrices 8, the red-emission filter 33, the blue-emission filter 34, and the green-emission filter 35 on the master substrate 1 through the use of the electrodepositing technique, the black matrices 8 formed of electrodeposit resin to have a thickness of 20 $\mu$m are formed on the peel layer 7a formed on the surface of the electrode 3 for forming the black matrices in the master substrate 1 through the use of an acrylic anion electrodeposit resin bath containing carbon black system black pigment at a density of 30 ml/l. Next, the red-emission filter 33 formed of the electrodeposit resin to have a thickness of 20 $\mu$m is formed on the peel layer 7b formed on the surface of the electrode layer 4 for forming the red filter through the use of the acrylic anion electrodeposit resin bath containing light-storage sulfide fluorescent pigment and anthraquinone system red pigment added thereto. Then, the blue-emission filter 34 formed of the electrodeposit resin to have a thickness of 20 $\mu$m is formed on the peel layer 7c formed on the surface of the electrode layer 5 for forming the red filter through the use of the acrylic anion electrodeposit resin bath containing light-storage sulfide fluorescent pigment and phthalocyanine blue system blue pigment added thereto. Further, the green-emission filter 35 formed of the electrodeposit resin to have a thickness of 20 $\mu$m is formed on the peel layer 7d formed on the surface of the electrode layer 6 for forming the green filter through the use of the acrylic anion electrodeposit resin bath containing light-storage sulfide and phthalocyanine green system green pigment added thereto.

Later, the similar method to the first embodiment is executed to form the color filter composed of the black matrices 8, the red-emission filter 33, the blue-emission filter 34 and the green-emission filter 35.

The different respect of the reflective color LCD element of this embodiment from the conventional LCD element is that the color filter composed of the black matrices 8, the red-emission filter 33, the blue-emission filter 34 and the green-emission filter 35 is formed on one surface of the plastic film substrate 27b on the other surface of which the transparent pixel electrode 28 is formed with the bonding film 26 laid between the color filter and the plastic film substrate 27b.

Those red-emission, blue-emission and green-emission filters 33, 34 and 35 are formed by electrodepositing the particles containing light-storage sulfide fluorescent pigment and the corresponding color pigment by using the electrodeposit resin. Hence, the color filter enables to output the normal color display and the emissions caused by the light-storage sulfide fluorescent pigment.

The reflective color LCD element shown in FIG. 19 is driven to emit the colors by passing the reflected light from the reflection plane 36 through the filters 33, 34 and 35 only when the LCD element is driven so that the light is incident to the LCD element. When the light is incident to the LCD element, the light-storage sulfide fluorescent pigment contained in the filters 33, 34 and 35 serves to store the incident light. This light-storing function makes it possible to keep the LCD element luminous a certain time later than when light energy from a ultraviolet to a visible ray of light stimulates the LCD element and the light stimulus is temporarily stored. The light-storage sulfide fluorescent pigment may be alkali-earth metal such as Zn and CaS.

The addition of the light-storage sulfide fluorescent pigment to each color-emission filter 33, 34 or 35 makes it possible to store the light while the LCD element is turned on in the environment where the ambient light is incident to the reflection plate 36. Hence, even when the LCD element is used in a dark place a certain time later than the interval when the LCD element is being used, the color-emission filter 33, 34 or 35 containing the light-stored component serves to be luminous.

That is, since the light-storage sulfide fluorescent pigment is electrodeposited in the mixed state with the color-emitting pigment for each filter color, even in the environment where no external light is incident to the LCD element, the light-storage sulfide fluorescent pigment serves to be luminous by virtue of the stored light merely turning on the LCD element. The color emissions caused by the stored light also promote the emissions of the color pigment of each filter 33, 34 or 35, so that the color-emission filters 33, 34 and 35 serve to generate the color emissions in a dark place. The combination of the fluorescent pigment with higher brightness than the normal pigment with the continuous color emissions caused in the light-storage pigments in the dark place serves to enhance the brightness of the color emissions, so that the color emissions are made more vivid.

Apparently, the color-emittable time when no ambient light is incident to the LCD element in a dark place depends on the quantity of light stored by the light-storage sulfide fluorescent pigment while the LCD element is used in a bright place where the ambient light is incident to the LCD element. Hence, the emittable time caused by the light-storage sulfide fluorescent pigment when no ambient light is incident to the LCD element is limited to a certain range. With the passage of the time in this state, it is more likelihood that the emissions are attenuated.

In the foregoing arrangement, each color-emission filter 33, 34 or 35 is composed of the corresponding color pigment and the light-storage sulfide fluorescent pigment contained in the electrodeposit resin. The following combinations (1) to (9) of the materials may be used in order that the color emissions in the normal usage time when the ambient light is incident to the LCD element and the emissions caused by the stored light when no ambient light is incident are made possible.

(1) Coloring pigment and light-storage pigment, (2) Coloring dye and light-storage pigment, (3) Coloring pigment and fluorescent pigment, (4) Coloring dye and fluorescent pigment, (5) Coloring pigment, light-storage pigment and fluorescent pigment, (6) Coloring dye, light-storage pigment and fluorescent pigment, (7) only light-storage pigment, (8) Only fluorescent pigment, and (9) Light-storage pigment and fluorescent pigment.

The light-storage pigments used in these combinations are inorganic pigments containing as a main component an alkali-earth metal sulfide such as ZnS or CaS. Today, the green and the violet inorganic pigments have been already developed. Since ZnS or CaS is somewhat dissolved in water, it is required to be water-resistant. For this purpose, for example, it is preferable to grain a transparent resin such as an acrylic resin and ZnS and CaS dispersed in the transparent resin for inhibiting to dissolve the material, and electrodeposit the resin particles containing ZnS and CaS dispersed in the electrodeposit liquid.

The fluorescent pigment is made by evenly dissolving the fluorescent dye such as fluorescein or rhodamine in a synthetic resin for making a solid solution and graining the solid solution. The solid solution resin includes an acrylic resin, a vinyl chloride resin, an alkid resin, a choline resin, a melamine resin, or their copolymer. For graining the solid solution containing a fluorescent dye, it is preferable to use the conventionally known massive resin pulverizing method, emulsion polymerization method, resin deposition method or the like. Further, the fluorescent pigment has two or three times as great a brightness as the normal pigment, so that the LCD element may reproduce a more vivid color image as described above.

As set forth above, in addition to a color decomposing function, the color filter of this invention includes the light-storage sulfide fluorescent pigment, the fluorescent pigment, the coloring dye, and the coloring pigment which emit light through the red-, the blue- and the green-emission filters 33, 34 and 35. Hence, the color filter enables to continuously emit colors for a certain period even in a dark place where no ambient light is incident. Therefore, though the conventional reflective LCD element is used only in a bright place, the reflective LCD element of this invention can offer a color display even in a dark place, so that it may be applied to a wider field of usage.

Further, the present embodiment concerns with the eflection type color LCD element. In place, a transission type color LCD element with a cold cathode fluorescent lamp as a light source or a half-transmission type color LCD element with an LED added to a half-transmissive reflection plate may be provided. The transmission type color LCD element is just required to remove the reflection plate 36 from the composition shown in FIG. 19 and locate a light source thereto. The half-transmissive color LCD element is just required to locate a half-transmission type reflection plate in place of the reflection plate 36 and face the LED on the half-transmissive reflection plate.

The transmission type color LCD element enables to emit the colors through the use of the color-emission filters 33, 34 and 35 by the application of light from the light source like the conventional structure, while the color LCD element continues the coloring function even if the light volume of the light source is lowered and the storage volume of the battery disappears, because of the addition of the light-storage sulfide fluorescent pigment thereto. Hence, the LCD element keeps the coloring function after the storage volume of the battery disappears as well as during an interval of no light application in a case that the light is intermittently applied from the light source. In the latter case, it is not necessary to constantly keep the backlight operated while the display is on. This makes contribution to greatly reducing the power consumption, which leads to reduction of a battery volume and an overall display in size.

The reduction of the power consumption caused by the light-storage pigment and the addition of the fluorescent pigment results in enhancing the coloring brightness and making the emissions more vivid. That is, if the color filter is applied to the reflection type color LCD element, even in the gloomy place where a light volume is short, as mentioned above, the fluorescent pigment offers two or three times as great a brightness as the normal pigment, so that the color LCD element may offer a more vivid coloring display. If the color filter is applied to the transmission type color LCD element, in a dark place, the fluorescent pigment serves to promote the coloring function with high brightness caused by the emissions of the light-storage pigment while the light-storage pigment continues to be luminous for a certain interval, so that the color LCD element enables to output a more vivid color display. Further, if the color filter is applied to the half-transmission type LCD element, the LCD element may be used in such a manner as synthesizing the light-transmission type with the reflection type. By intermittently operating the luminous body such as an LED located as the light source while the luminous body is operated for displaying an image, the half-transmission type LCD element enables to continuously output color emissions even while the luminous body is not operated. Like the transmission type, the reduction of the power consumption is made possible.

Embodiment 9

Later, the description will be oriented to the method for manufacturing a fine pattern according to a ninth embodiment of the present invention. Herein, the present embodiment concerns with the fine pattern used as an etching mask when manufacturing a printed board.

Figure 20:
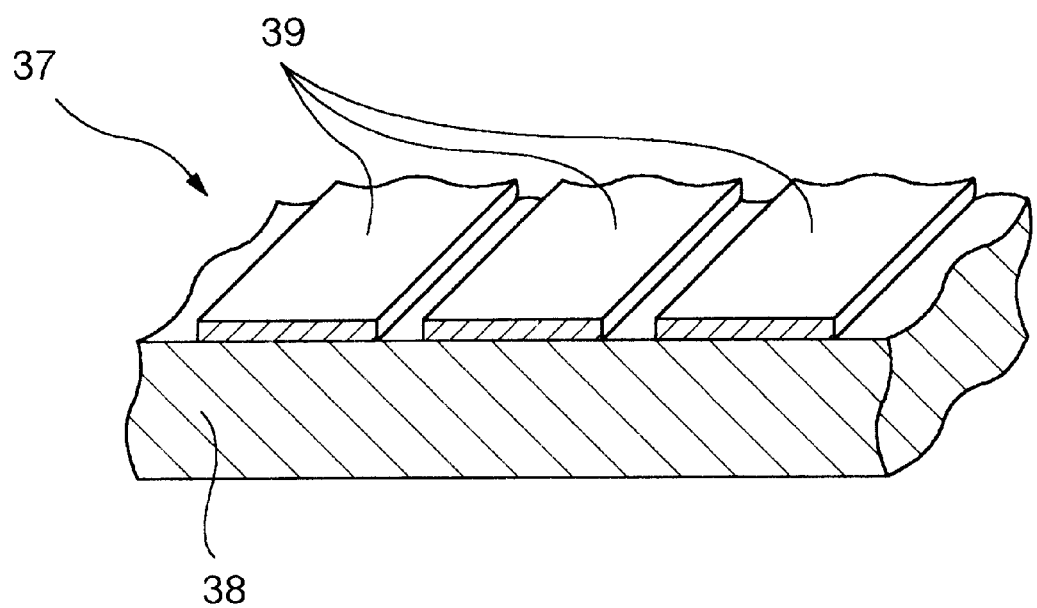
FIG. 20 is a perspective section showing an essential portion of a master substrate used for a method for manufacturing a fine pattern according to a ninth embodiment of the present invention.

FIG. 20 is a perspective view showing an essential portion of the master substrate for forming the fine pattern included in the ninth embodiment of the present invention. In FIG. 20, the fine pattern is formed on the master substrate 37 by means of the electro-deposition method. The patterned film is stripped off the master substrate 37 and then is transferred onto the media substrate. The master substrate 37 is composed of an insulating substrate 2 made of glass with a rigid property, for example, and a patterned electrode layer 39 formed on the insulating substrate 38, on which patterned electrode layer an etching mask for the wiring conductors of a given shape is formed.

The step of producing this type of master substrate 37 to the step of electrodepositing the patterned film will be described with reference to FIGS. 21A to 21C.

Figure 21A:
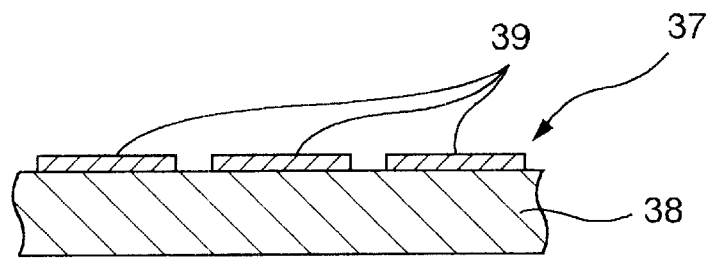
FIG. 21A is a sectional view showing the master substrate formed at the step of forming the fine pattern included in the method for manufacturing the fine pattern according to the ninth embodiment of the present invention.

FIG. 21A is a sectional view showing an essential portion of the master substrate shown in FIG. 20. FIG. 21B is a sectional view of an essential portion for indicating the step of forming the peel layer on the patterned electrode layer formed on the master substrate. FIG. 21C is a sectional view of an essential portion for indicating the step of forming the patterned film on the patterned electrode layer.

At first, a nickel thin film is formed on the rigid insulating substrate 38 made of glass by means of the sputtering method. This film has a thickness of 500 nm. Next, a positive photo resist is coated on the nickel film to have a thickness of 2 µm by means of the spin-coating method. Then, after exposing it with the photo mask, the resulting film is developed by sodium carbonate aqueous solution so that the resist pattern is formed in a manner to correspond to the patterned electrode layer 39. With this resist pattern as the etching mask, the nickel thin film formed on the insulating substrate 38 is etched by an etchant consisting of aqueous solution of nitric acid and acetic acid. Then, the resist pattern is removed by aqueous solution of sodium carbonate for forming the patterned electrode layer 39. The resulting master substrate 37 is used for the method for manufacturing the fine pattern according to the ninth embodiment of the present invention.

Figure 21B:
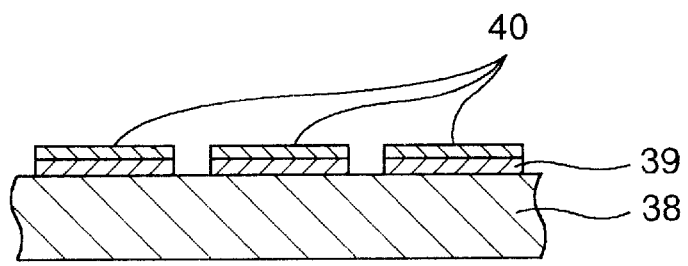
FIG. 21B is a sectional view showing an essential portion of the master substrate formed at the step of forming the fine pattern included in the method for manufacturing the fine pattern included in the method for manufacturing the fine pattern according to the ninth embodiment of the present invention.

Next, as shown in FIG. 21B, the peel layer 40 is formed on the patterned electrode layer 39. The peel layer 40 is water-repellent and conductive in liquid.

Figure 21C:
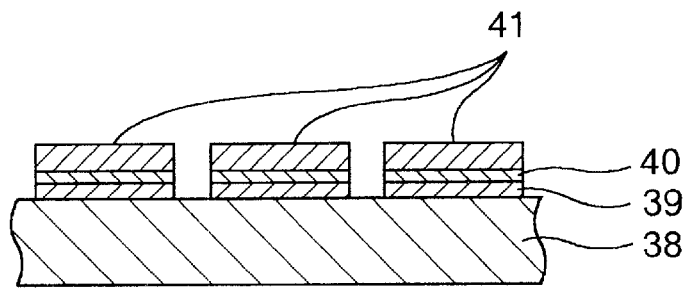
FIG. 21C is a sectional view showing an essential portion of the master substrate formed at the step of forming the fine pattern included in the method for manufacturing the fine pattern according to the ninth embodiment of the present invention.

Then, as shown in FIG. 21C, the patterned film 41 is formed of electrodeposit resin and has a thickness of 2 µm. This patterned film is electrodeposited on the surface of the peel layer 40 formed on the patterned electrode layer 39 by using an acrylic anion electrodeposit resin bath to which phthalocyanine blue pigment is added at a density of 30 ml/l. Herein, since the particles such as pigment except the electrodeposit resin is included in the electrodeposit resin, the particles are served as an aggregate so that the shape of the patterned film 41 is unlikely to be transformable in stripping and transferring the film 41.

Then, the description will be oriented to the process of stripping and transferring on the media substrate the patterned film 41 formed as described above according to the embodiment.

Figure 22:
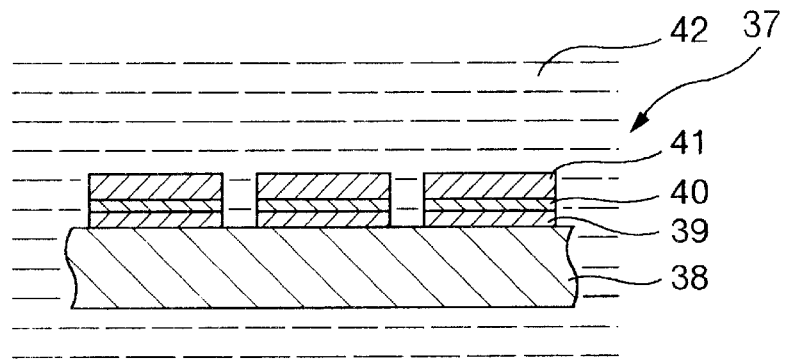
FIG. 22 is a sectional view showing an essential portion of the master substrate for indicating the water-impregnating step included in the method for manufacturing the fine pattern according to the ninth embodiment of the present invention.
Figure 23A:
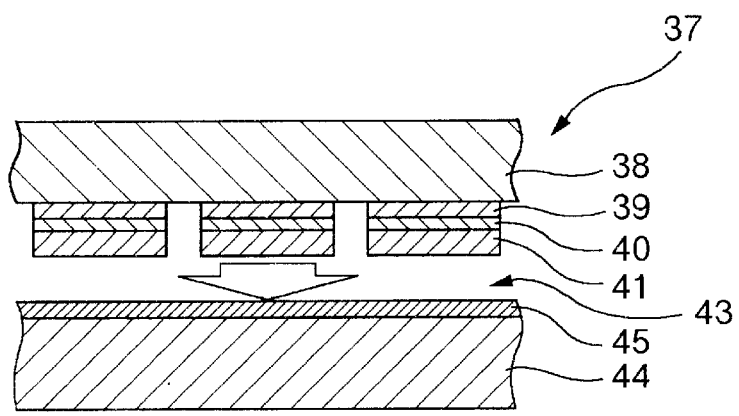
FIG. 23A is a sectional view showing essential portions of the master substrate and the media substrate for indicating the stripping and transferring step included in the method for manufacturing the fine pattern according to the ninth embodiment of the present invention.
Figure 23B:
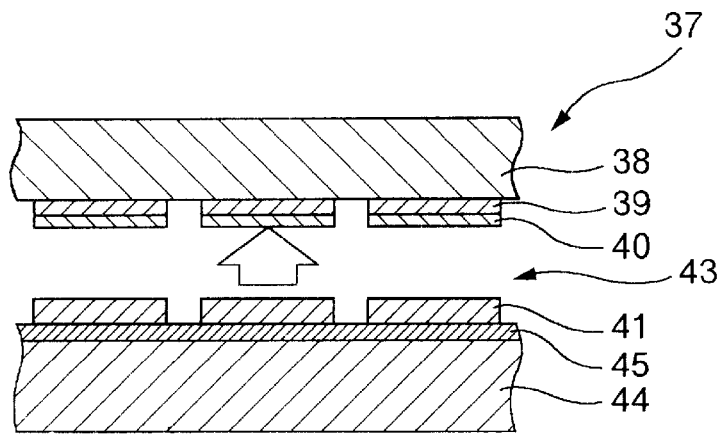
FIG. 23B is a sectional view showing the essential portions of the master substrate and the media substrate for indicating the stripping and transferring step included in the method for manufacturing the fine pattern according to the ninth embodiment of the present invention.

FIG. 22 is a sectional view of an essential portion for showing a step of impregnating the patterned film formed on the master substrate with hot water. FIG. 23A is a sectional view of an essential portion for showing a step of stripping and transferring the patterned film formed on the master substrate onto the media substrate. FIG. 23B is a sectional view of an essential portion for indicating the patterned film stripped and transferred onto the media substrate.

At first, as shown in FIG. 22, the master substrate 37 on which the patterned film 41 is electrodeposited is dipped in the hot water 42 of 70° C. for one minute. This is for sufficiently impregnating the patterned film 41 with hot water and heating the film 41.

Next, the media substrate 43 is prepared to have a copper foil 45 with a thickness of 18 µm formed on the surface of a flexible polyimide film 44. Then, the media substrate 43 is impregnated with hot water. This results in impregnating the inside of the patterned film 41 contacting with the master substrate with water so that the bonding force is made weaker by virtue of the water-repellency of the peel layer 40 formed on the surface of the master substrate 37 and heating the surface of the patterned film 41 so that the surface of the master substrate 37 may be made viscous. Then, the resulting master substrate 37 is taken out of the hot water and then is bonded with and pressurized onto the media substrate 43 as shown in FIG. 6.

Then, when the master substrate 37 is stripped off the media substrate 43, as shown in FIG. 23B, the patterned film 41 can be easily and completely stripped and transferred onto the media substrate 43. After the film 41 is stripped off the master substrate 37, again, the patterned film 41 is electrodeposited on the master substrate 37. Turning to FIG. 22, the master substrate 37 may be repetitively used for transferring the patterned film 41.

In turn, the description will be oriented to the etching process with the patterned film 41 stripped and transferred on the media substrate as an etching mask with reference to FIG. 24.

Figure 24A:
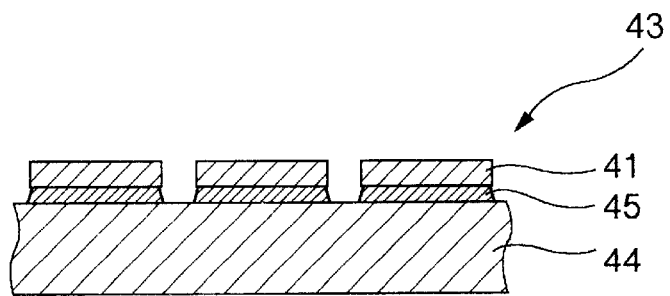
FIG. 24A is a sectional view showing an essential portion of the media substrate for indicating the etching step included in the method for manufacturing the fine pattern according to the ninth embodiment of the present invention.
Figure 24B:
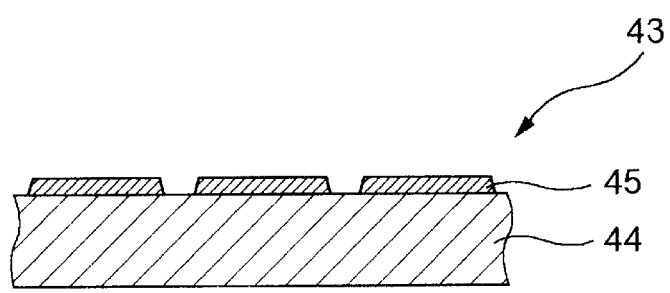
FIG. 24B is a sectional view showing an essential portion of the media substrate for indicating the etching step included in the method for manufacturing the fine pattern according to the ninth embodiment of the present invention.

At first, the patterned film 41 transferred on the surface of the media substrate 43 is heated and dried for thirty minutes at a temperature of 140° C. so as to raise the bonding strength between the patterned film 41 and the copper foil 45 formed on the surface of the media substrate 43. Next, as shown in FIG. 24A, with the heated and dried patterned film 41 as an etching mask, the exposed portion of the copper foil 45 is etched by aqueous solution of iron chloride. Then, the patterned film 41 is removed by aqueous solution of sodium hydrate. As shown in FIG. 24B, the printed board can be obtained. The resulting printed board is formed to have copper wires shaped to the fine pattern on the polyimide film 44.

As a material of the peel layer 40 used in this embodiment, it is possible to use a metallic compound film such as a nickel compound film including graphite fluoride particles such as grainy polytetrafluoroethylene formed by the composite plating method, a graphite fluoride thin film formed by the vacuum evaporating method such as the sputtering method, or a water-repellent thin film such as a fluorine coating agent such as fluorine oil formed by the method of application or the dip-coating method.

As for the metallic compound film including the graphite fluoride particles, it is necessary to uniformly disperse the graphite fluoride particles inside of the metallic film when the film is formed. Further, as for the graphite fluoride thin film or the fluorine coating agent, though both of them are low in conductivity, it is possible to form the thin film that is water-repellent and electrically conductive enough to allow the electrodeposit in liquid by keeping the formed thin film in the range of 5 nm to 100 nm.

For example, the experiments executed by the present inventors have proved that if the graphite fluoride film having a thickness of 5 nm, 15 nm, 30 nm, and 100 nm is formed as the peel layer 40 formed on the patterned electrode layer by means of the sputtering method, the patterned film can be electrodeposited on the graphite fluoride film of each thickness and when the patterned film is impregnated with water, the patterned film is water-repellent enough to weaken the bonding force with the peel layer. However, the graphite fluoride film having a thickness of 200 nm has no conductivity, so that the patterned film cannot be electrodeposited thereon. Instead, the patterned film can be electrodeposited on the graphite fluoride film having a thickness of 3 nm. However, the film of this thickness is hardly water-repellent, so that the bonding force of the patterned film cannot be sufficiently weakened. Hence, if the thickness of the peel layer 40 is less than 5 nm, the peel layer 40 is less water-repellent, so it is likelihood that the bonding force of the patterned film with the peel layer 40 cannot be sufficiently weakened. On the other hand, if the thickness of the peel layer 40 is more than 100 nm, the resistance of the peel layer 40 is made so large that the patterned film is unlikely to be electrodeposited on the peel layer 40. Both of the cases are not preferable.

The useful material as the fluorine coating agent is fluorine oil or perfect fluorine oil. Assuming that X and Y are a hydrolyzable group, it is preferable that the fluorine coating agent may have silicone SiX3 and titanium TiY3 as its terminal group. The hydrolyzing reaction with the hydroxyl group of the surface of the patterned electrode layer 39 makes the bond more stubborn and improves the endurance of the peel layer when the master substrate is repetitively used. In particular, in a case that the peel layer 40 made of the fluorine coating agent is a water-repellent thin film composed of Perfluoro polyether having a silicone compound or a titanium compound as a terminal group, since the terminal group is likely to adhere to the electrode layer formed on the master substrate, the peel layer 40 may be easily formed to have a desirous thickness by means of the dip-coating method. Hence, it is possible to uniformly form the water-repellent thin film having conductivity in liquid because of its thinness on the master substrate 37.

According to the ninth embodiment of the present invention, if the used hot water is lower than 40° C., for example, 25° C., the heated surface of the patterned film cannot provide sufficient viscosity, so that the complete strip and transfer of the patterned film onto the media substrate is not made possible. On the other hand, in the case of each water temperature of 40° C., 50° C., 60° C., 70° C., 80° C. and 90° C., the heated surface of the patterned film is made viscous, so that the inside of the patterned film contacting with the master substrate is impregnated with water and the water-repellency of the peel layer formed on the master substrate 1 serves to weaken the bonding force. This makes it possible to repetitively do the complete strip and transfer with excellent reproducibility. In particular, in the transfer at the water temperature of 80° C. or 90° C., the hot water impregnated inside of the patterned film is made shorter in amount because of its high temperature. However, if the water-repellent thin film composed of Perfluoro polyether found by the inventors is used as the peel layer, the peel layer offers a great water-repellent effect though a small amount of water is impregnated in the peel layer, so that the complete strip and transfer of the patterned film is made possible.

If the water temperature is higher than 90° C., for example, 95° C., the water impregnated inside of the patterned film is evaporated out. Hence, even the water-repellent effect of the water-repellent thin film composed of Perfluoro polyether cannot reach the complete strip and transfer. Those results indicate that the present invention is effective if the hot water with which the master substrate is impregnated ranges in temperature from 40° C. to 90° C. In particular, from a viewpoint of the operability, the preferable water temperature is around 70° C., because no waiting time is required for the strip and transfer.

Further, according to this embodiment of the invention, for preventing transformation of the patterned film 41 in its strip and transfer, the patterned film 41 includes particles such as pigment other than the electrodeposit resin as an aggregate. The inclusion of the particles other than the electrodeposit resin serves to lower the viscosity of the heated patterned film. However, the water impregnated in the patterned film 41 and the water-repellency of the peel layer 40 formed on the surface of the master substrate 37 make it possible to weaken the bonding force of the peel layer 40 with the master substrate 37. Hence, the patterned film 41 that is unlikely to be transformable and less viscous can be repetitively, well-reproducibly and completely stripped and transferred without changing the shape of the patterned film.

The similar effect can be obtained if the inclusion of the particles other than the electrodeposit resin is varied in the thickness direction of the patterned film 41. In particular, a smaller inclusion of the particles other than the electrodeposit resin in the portion contacting with the media substrate 43 and a larger inclusion of the particles other than the electrodeposit resin in the portion that does not contact with the media substrate 43 make it possible to keep the portion of the patterned film 41 contacting with the media substrate 43 more viscous but the other portion less viscous and transformable. This allows the patterned film 41 to be repetitively, well-reproducibly and completely stripped and transferred as keeping the pattern shape. Further, if two or more kinds of particles other than the electrodeposit resin are inclusively laminated in the thickness direction of the patterned film 41, the similar effect can be obtained. The particles other than the electrodeposit resin to be used by the invention are those composed of an organic material such as various kinds of pigment or those composed of an inorganic material such as titanium oxide or silicon oxide.

For the purpose of preventing unintentional transformation of the patterned film 41 and providing the film 41 with the viscosity for effectively executing the strip and transfer, it is necessary to take the steps of electrodepositing the electrodeposit resin that is unlikely to be transformable on the limited portions of the patterned film contacting with the master substrate 37, electrodepositing the electrodeposit resin that is likely to be viscous on the limited portions contacting with the media substrate 43, and impregnating the resulting patterned film 41 composed of these electrodeposit resins with hot water. Hence, the water-repellency of the peel layer 40 serves to weaken the bonding force of the electrodeposit resin that is unlikely to be transformable with the mater substrate 37. The electrodeposit resin contacting with the media substrate 43 is heated by the hot water so that the electrodeposit resin may be made viscous. The weakened bonding force and the viscous electrodeposit resin make it possible to repetitively, well-reproducibly and completely strip and transfer the patterned fine without changing the shape of the pattern.

The similar effect is also offered by the lamination of the electrodeposit resins whose glass transition temperatures are different from each other. In particular, the electrodeposit resin with a high glass transition temperature is electrodeposited on the limited portions of the patterned film 41 contacting with the master substrate 37. The electrodeposit resin with a low glass transition temperature is electrodeposited on the limited portions contacting with the media substrate 43. Then, the patterned film 41 composed of these electrodeposit resins is impregnated with the hot water whose temperature is equal to or lower than the glass transition temperature of the electrodeposit resin for the portions of the film 41 contacting with the master substrate 37 but is equal to or higher than the glass transition temperature of the portions of the film 41 contacting with the media substrate 43. Hence, the water-repellency of the peel layer 40 serves to weaken the bonding force of the electrodeposit resin of the high glass transition temperature with the master substrate 37. The electrodeposit resin of the low glass transition temperature contacting with the media substrate 47 is heated by the hot water so that the resin is made viscous. The weakened bonding force and the viscous resin make it possible to repetitively, well-reproducibly and completely strip and transfer the pattern without changing its shape.

Further, the similar effect may be offered by the lamination of the electrodeposit resins whose resin hardening means are different from each other. In particular, the photo-setting electrodeposit resin is electrodeposited on the limited portions of the film 41 contacting with the master substrate 37. The thermosetting electrodeposit resin is electrodeposited on the limited portions of the film 41 contacting with the media substrate 43. Once the photo-setting electrodeposit resin contacting with the master substrate 37 is hardened by the ultraviolet rays, the patterned film 41 composed of these electrodeposit resins is dipped into the hot water. As a result, the water-repellency of the peel layer 40 serves to weaken the bonding force of the photo-set electrodeposit resin formed on the surface of the master substrate 37 with the master substrate 37. Further, the thermosetting electrodeposit resin contacting with the media substrate 43 is heated by the hot water so that the electrodeposit resin is made viscous. The weakened bonding force and the viscous electrodeposit resin make it possible to repetitively, well-reproducibly and completely strip and transfer the patterned film 41 without changing the shape of the pattern.

Embodiment 10

Later, the description will be oriented to the method for manufacturing a fine pattern (or a patterned film) according to the tenth embodiment of the present invention. This embodiment concerns with the use of the fine pattern as a plating mask used for manufacturing the printed board.

Figure 25:
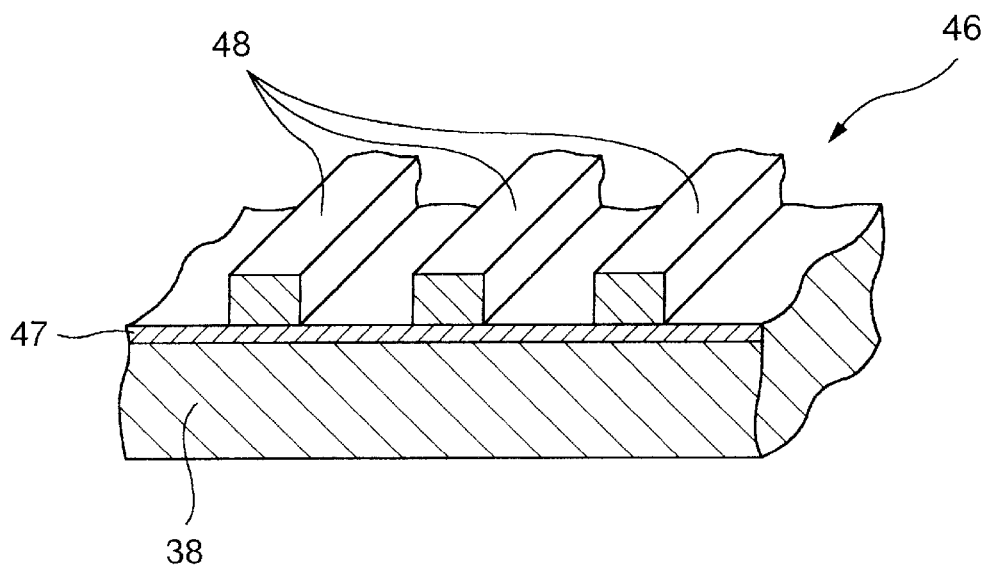
FIG. 25 is a perspective section showing an essential portion of the master substrate used for a method for manufacturing a fine pattern according to a tenth embodiment of the present invention.

FIG. 20 is a perspective view showing a composition of the master substrate for forming the fine pattern according to the tenth embodiment of the invention. In FIG. 25, the fine pattern is formed on the master substrate 46 by means of the electrodeposit method. Hence, the master substrate 46 has an effect that the patterned film is stripped and transferred onto the media substrate. The master substrate 46 is composed of an insulating substrate 38 formed of a rigid glass, a conductive layer 47 laminated on the insulating substrate 38, and a patterned insulating layer 48 for forming on the conductive layer 47 a plating mask of wiring conductors according to a given form.

Figure 26A:
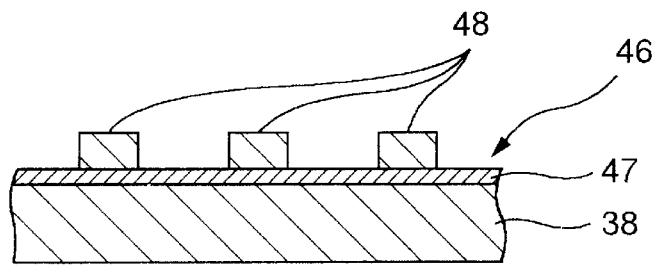
FIG. 26A is a sectional view showing an essential portion of the master substrate formed at the step of forming the fine pattern included in the method for manufacturing the fine pattern according to the tenth embodiment of the present invention.
Figure 26B:
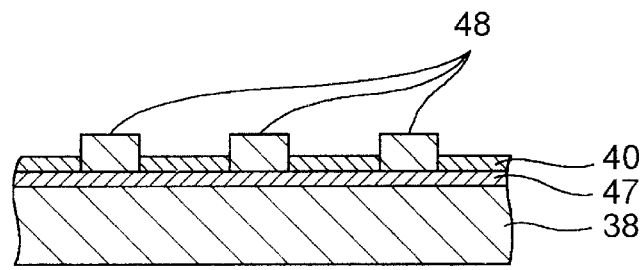
FIG. 26B is a sectional view showing an essential portion of the master substrate formed at the step of forming the fine pattern included in the method for manufacturing the fine pattern according to the tenth embodiment of the present invention.
Figure 26C:
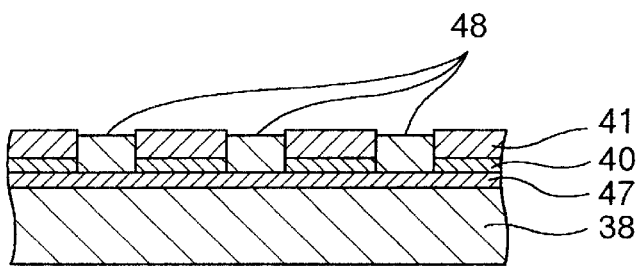
FIG. 26C is a sectional view showing an essential portion of the master substrate formed at the step of forming the fine pattern included in the method for manufacturing the fine pattern according to the tenth embodiment of the present invention.

The description will be oriented to the process for forming the patterned film included in the method for manufacturing the master substrate 46 with reference to FIGS. 26A to 26C.

FIG. 26A is a sectional view showing an essential portion of the master substrate according to the tenth embodiment of the invention. FIG. 26B is a sectional view of an essential portion for indicating the step of forming the peel layer on the conductive layer formed on the master substrate. FIG. 26c is a sectional view of an essential portion for indicating the step of forming the patterned film on the conductive layer.

At first, a nickel film with a thickness of 500 nm is formed on the rigid insulating substrate 38 made of glass by means of the sputtering method. Next, photosensitive polyimide resin is coated to have a thickness of 30 $\mu$m by means of the spin-coating method. Then, after it is exposed with the photo mask laid on, the resulting substrate is developed by methyl pyrrolidone system aqueous solution for forming the corresponding resist pattern to the patterned insulating layer 48. By curing the resist pattern, it is possible to form the patterned insulating layer 48 made of polyimide resin. This layer 48 is heatproof and durable and has a thickness of 20 $\mu$m. As shown in FIG. 26A, this process is executed to form the master substrate 46 used in the method for manufacturing the fine pattern according to the tenth embodiment of the invention.

Next, as shown in FIG. 26B, the peel layer 40 is formed on the conductive layer 47 so that the layer 40 is water-repellent and conductive in liquid. Then, as shown in FIG. 26C, the patterned film 41 with a thickness of 25 $\mu$m is electrodeposited on the surface of the peel layer 40 formed on the conductive layer 47 by using an acrylic anion electrodeposit resin bath to which a blue pigment of a phthalocyanine blue system is added at a density of 30 ml/l. Herein, the electrodeposited patterned film 41 includes particles such as a pigment other than the electrodeposit resin. These particles are served as an aggregate, so that the patterned film 41 is unlikely to be transformable in stripping and transferring the film 41.

Figure 27:
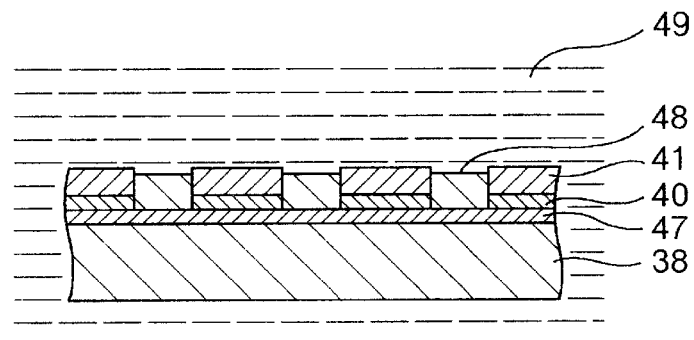
FIG. 27 is a sectional view showing an essential portion of the master substrate for indicating a water-impregnating step included in the method for manufacturing the fine pattern according to the tenth embodiment of the present invention.

In turn, the description will be oriented to the process for stripping and transferring the patterned film formed as above according to this embodiment onto the media substrate with reference to FIGS. 27 and 28.

Figure 28A:
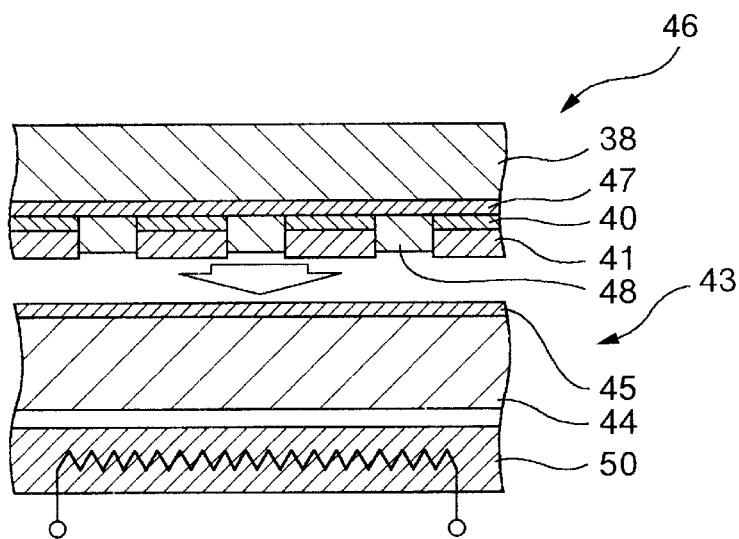
FIG. 28A is a sectional view showing essential portions of the master substrate, the media substrate and the heater for indicating the stripping and transferring step included in the method for manufacturing the fine pattern according to the tenth embodiment of the present invention.
Figure 28B:
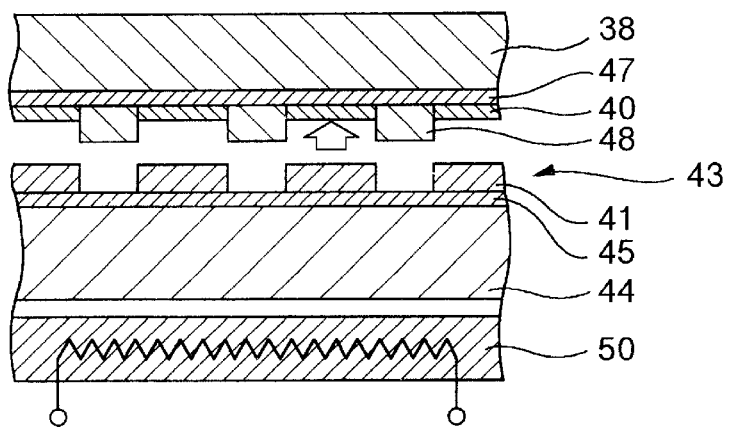
FIG. 28B is a sectional view showing essential portions of the master substrate, the media substrate and the heater for indicating the stripping and transferring step included in the method for manufacturing the fine pattern according to the tenth embodiment of the present invention.

FIG. 27 is a sectional view of an essential portion for indicating the step of impregnating the patterned film formed on the master substrate with water. FIG. 28A is a sectional view of an essential portion for indicating the step of stripping and transferring the patterned film onto the media substrate. FIG. 28B is a sectional view of an essential portion for indicating the patterned film stripped off the master substrate and transferred onto the media substrate.

At first, as shown in FIG. 27, the master substrate 46 on which the patterned film 41 is electrodeposited is dipped in pure water 49 for one minute. This is for sufficiently impregnating the patterned film 41 with water.

Next, the media substrate 43 is prepared. This media substrate includes a copper foil 45 of a thickness of 1 $\mu$m formed on the surface of the flexible polyimide film 44. Then, the master substrate 46 is taken out of the pure water. As shown in FIG. 28A, the patterned film 41 formed on the master substrate 46 is closely contacted with the media substrate 43, and then the media substrate 43 with the patterned film 41 contacted therewith is heated up to 70° C. by a heater 50. As a result, the patterned film 41 contacted with the master substrate 46 includes hot water therein. Hence, the water-repellency of the peel layer 40 formed on the master substrate 46 serves to weaken the bonding force of the film 41 with the master substrate 46. Further, the hot water serves to heat the surface of the patterned film 41 so that the film surface is made viscous.

Therefore, after the water-impregnated patterned film is stripped off the media substrate 43, as shown in FIG. 28B, the patterned film 41 is allowed to be easily and completely stripped and transferred onto the media substrate 43 without changing the pattern shape. Further, on the master substrate 46 from which the patterned film 41 is stripped, a new patterned film 41 is formed by the electrodeposit method. Then, turning to FIG. 27, the master substrate 46 may be reused for transferring the patterned film.

Then, the description will be oriented to the plating step at which the patterned film 41 transferred on the media substrate 43 is used as a plating mask as described above with reference to FIG. 29.

At first, the patterned film 41 transferred onto the surface of the media substrate 43 is heated and dries at a temperature of 140° C. for thirty minutes, for enhancing the bonding force of the copper foil 45 with the surface of the media substrate 43.

Figure 29A:
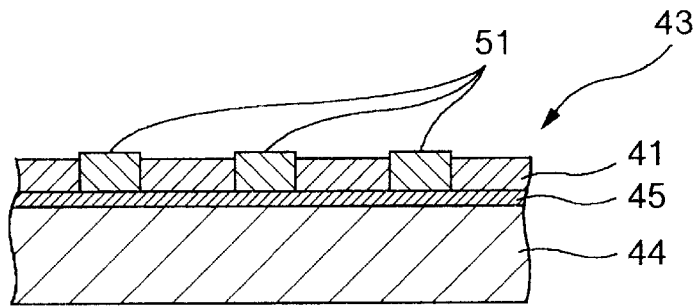
FIG. 29A is a sectional view showing an essential portion of the media substrate for indicating a plating step included in the method for manufacturing the fine pattern according to the tenth embodiment of the present invention.
Figure 29B:
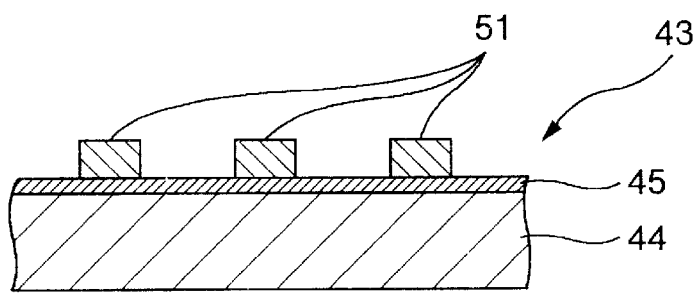
FIG. 29B is a sectional view showing an essential portion of the media substrate for indicating the plating step included in the method for manufacturing the fine pattern according to the tenth embodiment of the present invention.
Figure 29C:
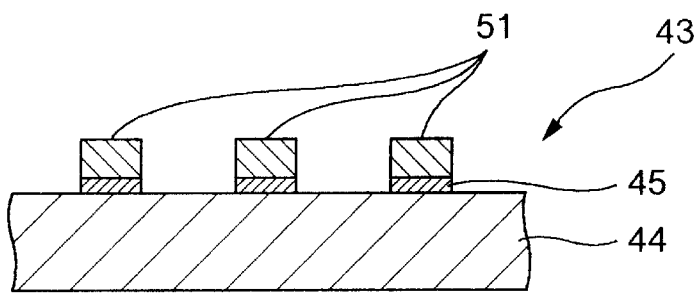
FIG. 29C is a sectional view showing an essential portion of the media substrate for indicating the plating step included in the method for manufacturing the fine pattern according to the tenth embodiment of the present invention.

Next, as shown in FIG. 29A, the heated and dried patterned film 41 is used as the plating mask. A copper plating film 51 is formed on the exposed portions of the copper foil 45 by means of the electro-plating method. Then, as shown in FIG. 29B, the patterned film is removed by the aqueous solution of sodium hydrate heated up to 70° C. Lastly, as shown in FIG. 29C, the copper foil portions on the polyimide film 44 other than the copper-plated portions are etched by ferric oxide system aqueous solution so that the copper wires are formed on the printed board according to the fine pattern.

Further, the description will be oriented to the plate transferring process in which the patterned film 41 is used as a plating mask with reference to FIG. 30.

At first, the patterned film 41 is formed on the surface of the media substrate 52 made of a conductive stainless substrate that is unlikely to adhere to the plated film by means of the method as shown in FIGS. 26 to 28. Then, the patterned film 41 transferred on the surface of the media substrate 52 is heated and dried at a temperature of 140° C. for thirty minutes, for enhancing the bonding force of the film 41 with the surface of the media substrate 52.

Figure 30A:
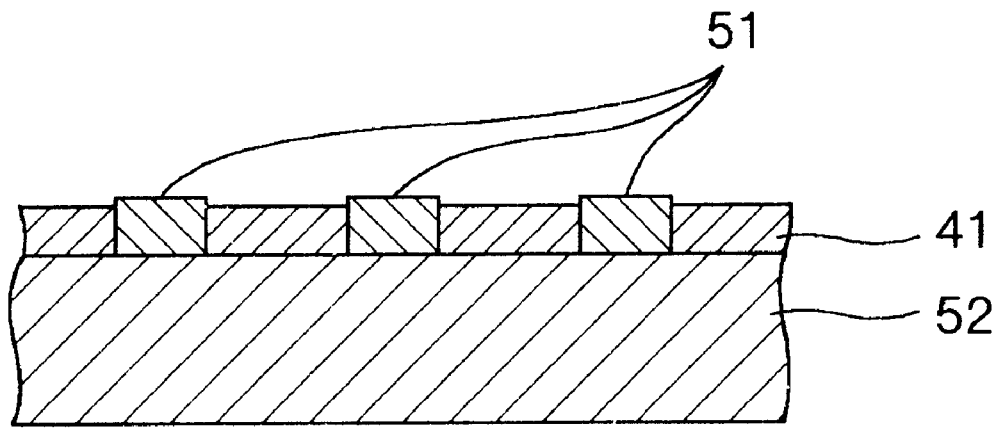
FIG. 30A is a sectional view showing an essential portion of the media substrate for indicating a plating and transferring step included in the method for manufacturing the fine pattern according to the tenth embodiment of the present invention.
Figure 30B:
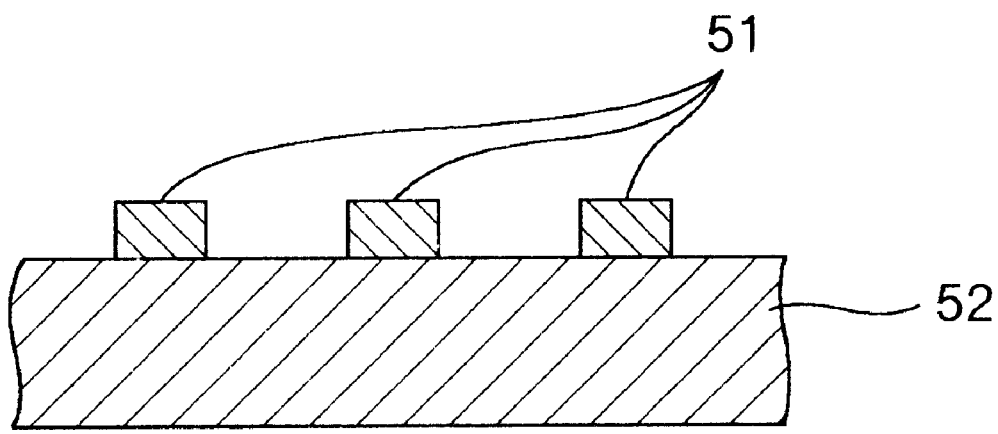
FIG. 30B is a sectional view showing an essential portion of the media substrate for indicating the plating and transferring step included in the method for manufacturing the fine pattern according to the tenth embodiment of the present invention.
Figure 30C:
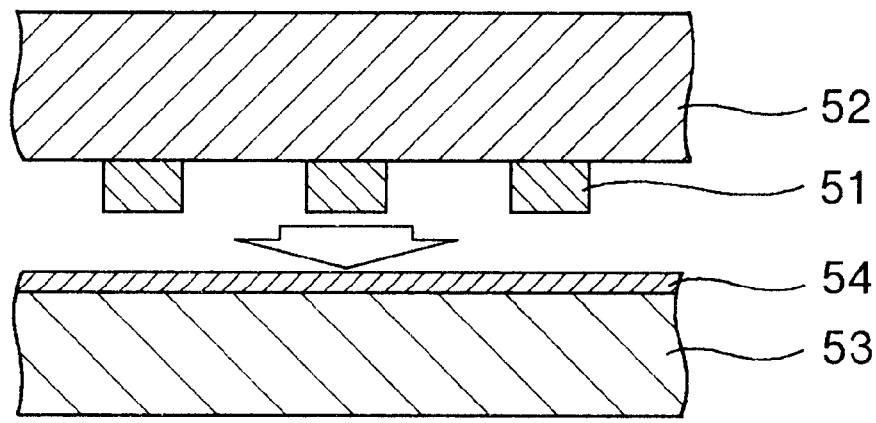
FIG. 30C is a sectional view showing an essential portion for indicating the plating and transferring step included in the method for manufacturing the fine pattern according to the tenth embodiment of the present invention.
Figure 30D:
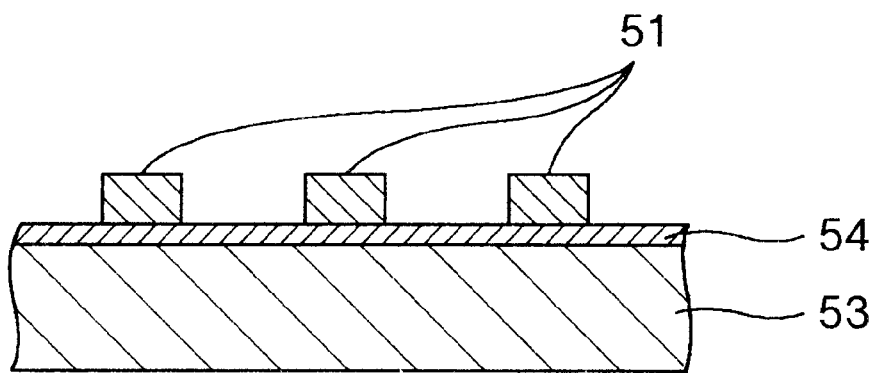
FIG. 30D is a sectional view showing an essential portion of the media substrate for indicating the plating and transferring step included in the method for manufacturing the fine pattern according to the tenth embodiment of the present invention.

Next, as shown in FIG. 30A, with the heated and dried patterned film 41 as the plating mask, the copper plating film 51 is formed on the exposed portions of the media substrate 52 by means of the electroplating method. Then, as shown in FIG. 30B, the patterned film is removed by the aqueous solution of sodium hydrate heated up to 70° C. Further, as shown in FIG. 30C, the resulting substrate is bonded with and pressurized against the bonding layer 54 composed of the copper plating film 51 formed on the polyimide film 53. Next, when the media substrate 52 is stripped, as shown in FIG. 30D, the copper plating film is transferred onto the polyimide film 53. Lastly, by curing the bonding layer 54 formed on the polyimide film 53, it is possible to form the printed board on which the copper wires shaped to the fine pattern are formed.

According to this embodiment, the media substrate 52 used in the plate transferring step utilizes the conductive stainless substrate that is unlikely to adhere to the plating film. In place, if the media substrate 52 may utilize the conductive substrate on which a mold coat of a matrix used for the electro-casting method is formed, the same effect may be obtained as well. In addition, the mold coat may be a titanium nitride film, a conductive oxide film, a porous oxide film, or a very thin organic coat film.

Further, according to this embodiment, the patterned insulating layer 48 composing the master substrate 46 is formed of a heatproof resin such as a polyimide resin whose heatproof temperature is 100° C. or higher. This is because the master substrate 46 may endure the hot water into which the substrate 46 is to be dipped and the heat to be added in stripping and transferring the film. In addition, according to this embodiment, a photo-sensitive heatproof resin such as a photo-sensitive polyimide resin is exposed and developed for forming the patterned insulating layer 48. In place, the similar effect may be obtained if the non-photo-sensitive resin is pattern-etched for forming the patterned insulating layer.

Moreover, according to this embodiment, the conductive layer 47 composing the master substrate 46 is laminated on the insulating substrate 38 by means of the sputtering method. In place, if the conductive substrate is served as a conductive layer and the patterned insulating layer may be directly formed on the conductive substrate, the similar effect can be obtained.

According to the ninth and the tenth embodiments, the patterned film is stripped off the rigid master substrate 37 or 46 and then is transferred on the flexible media substrate. After the master substrate 37 or 46 is closely bonded with the media substrate, both may be easily stripped off each other. Hence, the patterned film 41 formed on the master substrate 37 or 46 may be easily stripped and transferred on the media substrate. In addition, the similar effect can be obtained if the transfer of the pattern is done from the flexible master substrate to the rigid media substrate. Moreover, a thin metallic foil may be used as the flexible master substrate for achieving the similar effect.

The present invention offers the superior effects that will be discussed below.

The invention described in paragraphs (1) and (2) above is arranged to form the water-repellent thin film as the peel layer and impregnate the electrodeposit resin electrodeposited on the peel layer with water for the purpose of allowing the water-repellency of the peel layer to weaken the bonding force of the fine pattern made of the electrodeposit resin with the master substrate. The invention therefore offers the excellent effect of providing a capability of positively and completely stripping the fine pattern off the master substrate and transferring the fine pattern on the bonding layer of the media substrate and thereby forming the high-definition and high-density fine pattern with excellent reproducibility and massproductivity.

The strip and transfer operation is executed in the state of remarkably weakening the bonding force of the electrodeposit resin with the peel layer. Hence, the invention also offers the excellent effect of giving no damage to the peel layer and the patterned electrode layer of the master substrate when stripping and transferring the fine pattern and thereby extending the life of the master substrate.

Further, the media substrate may be a bonding layer with weak bonding strength so that the master substrate is not required to be forcibly stripped from the media substrate in the strip and transfer. Hence, the invention also offers the excellent effect of preventing the fine pattern from being misshaped or impaired and thereby improving a yield in the formation of the fine pattern.

The inventions described in paragraphs (3) and (4) above provide a capability of sufficiently impregnating the inside of the electrodeposit resin with water as progressively evaporating the water left on the surface of the electrodeposit resin composing the fine pattern. Hence, the inventions offer the excellent effect of improving the bonding characteristic between the bonding layer of the media substrate and the electrodeposit resin, shortening the waiting time between the water-impregnating step and the strip and transfer step, and obtaining a high bonding characteristic between the bonding layer and the electrodeposit resin for quite a short time, thereby being able to improve the productivity and the massproductivity.

The invention described in paragraphs (5)–(7) above offer the excellent effect of forming the conductive water-repellent thin film with a simple method, thereby being able to improve the productivity and the mass-productivity.

The invention described in paragraphs (8) above offers the excellent effects of providing the conductive layer made of less conductive fluoro-system compound with water-repellency and the peel layer with such a high conductivity as being bonded with the electrodeposit resin.

The inventions described in paragraphs (9)–(12) above offer the excellent effect of providing the high-definition and high-density color filter with excellent massproductivity, the color filter with the optical encoder scale, and the optical encoder scale.

The inventions described in paragraphs (13) and (14) above include the precisely pattern-formed color filter pre-produced on the plastic film substrate. Hence, the inventions offer the excellent effect of outputting a well color-reproducible and high-quality image with no color or brightness unevenness.

Further, since the color filter is pasted with the bonding film, the color filter is not increased in extra weight. And, the substrate is a lightweight plastic film one. Hence, the inventions offer the excellent effect of reducing the color LCD element in weight.

Moreover, the inventions also offer the excellent effect of absorbing the stress caused by the difference of the thermal expansion coefficient between the plastic film substrate and the color filter by the bonding film in the case of adding heat to the liquid crystal material and thereby suppressing the change of shape such as transformation of the plastic film substrate.

The inventions described in paragraphs (15)–(17) above provide a capability of implementing the color filter containing at least one kind of the light-storage and fluorescent coloring particles sealed in the electrodeposit resin. Hence, the inventions offer the excellent effect of allowing the color filter to emit the colors for a certain length of time by virtue of the light-storage coloring particles even if no light is applied from the light source such as a cold cathode fluorescent lamp or the luminous body such as an LED.

The invention described in paragraph (18) above offers the excellent effect of providing a capability of emitting the colors in a dark place where no ambient light is applied to the color LCD element, making the color emissions brighter and more vivid, and the display more vivid even in the environment where a light volume is short if the coloring color filter is applied to the color LCD element.

According to the invention described in paragraph (19) above, the water-repellent film is formed on the peel layer and the patterned film is formed on the peel layer by means of the electro-plating method. Then, the patterned film is impregnated with hot water whose temperature is equal to or higher than 40° C. but is equal to or lower than 90° C. The hot water impregnated inside of the film serves to weaken the bonding force by virtue of the water-repellency of the peel layer formed on the surface of the master substrate. And, the hot water serves to heat the surface of the patterned film so that the surface of the film is provided with viscosity. Hence, the patterned film is allowed to be well-reproducibly and completely stripped and transferred onto the media substrate and the patterned film is not degraded and keeps excellent yields when stripping and transferring it. As a result, the invention offers an excellent effect that the high-definition and high-density patterned film may be reliably massproduced at a low cost.

According to the invention described in paragraph (20) above, at the step of forming the peel layer, the peel layer is formed of a water-repellent film composed of Perfluoro polyether having a silicone compound or a titanium compound as a group terminal. This terminal group has a property that it is likely to adhere to the electrode layer formed on the master substrate. Hence, the water-repellent film made of Perfluoro polyether being conductive in liquid because of its thinness can be easily and evenly formed on the master substrate. The invention thus offers the excellent effect that the peel layer may be easily reproduced when reusing the master substrate.

According to the inventions described in paragraphs (21) and (22) above, since the patterned film formed by the electroplating method includes particles other than the electrodeposit resin, the shape of the patterned film is unlikely to be transformable and the patterned film may be stripped and transferred onto the media substrate without changing the shape of the pattern. The inventions thus offer the excellent effect that the high-definition and high-density patterned film may be reliably massproduced at a low cost.

The inventions described in paragraphs (23) and (24) above offer the excellent effect that the method for manufacturing the fine pattern may be executed for manufacturing a printed board that is superior in massproductivity and cost.

What is claimed is:

1. A method for manufacturing a fine pattern comprising the steps of:
    forming a master substrate having an insulating substrate and an electrode layer patterned to a predetermined shape and formed on said insulating substrate;
    forming a peel layer formed of a conductive and water-repellent thin film on said master substrate;
    forming a fine pattern made of electrodeposit resin on said peel layer;
    impregnating said electrodeposit resin with hot water of 15° C. to 80° C.; and
    stripping said fine pattern off said master substrate and transferring said fine pattern on a bonding layer of a media substrate.

2. The method for manufacturing a fine pattern as claimed in claim 1, wherein the process at said strip and transfer step is executed to strip and transfer said fine pattern on said bonding layer of said media substrate being heated.

3. The method for manufacturing a fine pattern as claimed in claim 1, wherein the process at said strip and transfer step is executed to keep said master substrate in contact with said media substrate and heat and pressure both of said substrates, for stripping and transferring said fine pattern.

4. The method for manufacturing a fine pattern as claimed in claim 1, wherein the process at said step of forming the peel layer is executed to form said peel layer made of a metal film containing fluororesin on said master substrate.

5. The method for manufacturing a fine pattern as claimed in claim 1, wherein the process at said step of forming said peel layer is executed to form the peel layer made of a fluororesin thin film on said master substrate.

6. The method for manufacturing a fine pattern as claimed in claim 1, wherein the process at said step of forming said peel layer is executed to form the peel layer made of a fluoro-sys tem coating agent.

7. The method for manufacturing a fine pattern as claimed in claim 6, wherein said peel layer is formed to have a thickness of 5 nm to 100 nm.

8. A color filter having a fine pattern manufactured by the method for manufacturing a fine pattern described in claim 1, comprising:
    said media substrate formed of a flexible and light-transmissive material;
    said bonding layer formed of a light-transmissive material; and
    said fine pattern formed of the electrodeposit resins of at least two colors.

9. The color filter as claimed in claim 8 further comprising a shading pattern shaped to an optical encoder scale and made of shading electrodeposit resin and formed on said bonding layer.

10. A shading pattern filter having a fine pattern manufactured by the method for manufacturing the fine pattern described in any one of claims 1 to 7, comprising:

said media substrate formed of a flexible and light-transmissive material;

said bonding layer formed of a light-transmissive material; and said fine pattern formed of shading electrodeposit resin.

11. The shading pattern filter as claimed in claim 10, wherein a light-transmissive pattern made of light-transmissive electrodeposit resin is provided on said bonding layer substantially integrally with said shading pattern.

12. The color filter as claimed in claim 8, wherein at least one kind of light-storage and fluorescent coloring particles is sealed in the electrodeposit resin layer.

13. The color filter as claimed in claim 12, wherein the coloring particles contain one of light-storage and fluorescent pigment in transparent resin particles.

14. The color filter as claimed in claim 12 or 13, wherein said coloring particles contain one of pigment and dye having the same coloring tendency as the color of said coloring particles.

15. A color LCD element comprising:

said color filter described in claim 12; and a liquid crystal element optically coupled with said color filter.

16. The method for manufacturing a fine pattern as claimed in claim 1, wherein said hot water is of 50° C.

17. A method for manufacturing a fine pattern, comprising the steps of:

forming a patterned electrode layer of a given shape on a substrate for producing a master substrate;

forming a peel layer made of a water-repellent film on said master substrate;

forming a patterned film on said peel layer by means of the electrodeposit method;

impregnating said patterned film with hot water of 40° C. to 90° C.; and closely contacting said patterned film impregnated with hot water and formed on said master substrate with a media substrate, stripping said patterned film off said master substrate, and transferring said patterned film onto said media substrate.

18. The method for manufacturing a fine pattern as claimed in claim 17, wherein the step of forming said peel layer is executed to form as the peel layer a water-repellent film composed of Perfluoro polyether having a silicone compound or a titanium compound as a terminal group on said master substrate.

19. The method for manufacturing a fine pattern as claimed in any one of claims 17 and 18, wherein said patterned film includes particles other than electrodeposit resin.

20. The method for manufacturing a fine pattern as claimed in claim 19, wherein an inclusion of said particles other than the electrodeposit resin in said patterned film is changing in the film thickness direction.

21. A printed board manufactured by forming a patterned film stripped off a master substrate and transferred onto a media substrate composed of an insulating material and a metallic foil according to the method for manufacturing a fine pattern as claimed in claim 17, utilizing said patterned film as an etching mask, and removably etching said metallic foil.

22. A printed board manufactured by forming a patterned film stripped off a master substrate and transferred onto a media substrate composed of an insulating material and the like according to the method for manufacturing a fine pattern as claimed in claim 17; utilizing said patterned film as a plating mask, and plating a metal film on said media substrate.

* * * * *

UNITED STATES PATENT AND TRADEMARK OFFICE
CERTIFICATE OF CORRECTION

PATENT NO. : 6,162,569
DATED : December 19, 2000
INVENTOR(S) : NAKASHIMA et al.

It is certified that error appears in the above-identified patent and that said Letters Patent is hereby corrected as shown below:

ON THE TITLE PAGE
Item [63] should be "5,916,735" instead of "5,961,735."

Signed and Sealed this

Twenty-ninth Day of May, 2001

*Attest:*

NICHOLAS P. GODICI

*Attesting Officer*     *Acting Director of the United States Patent and Trademark Office*